United States Patent
Tsutsumi et al.

(10) Patent No.: US 8,366,872 B2
(45) Date of Patent: Feb. 5, 2013

(54) SUBSTRATE TREATMENT METHOD, COATING FILM REMOVING APPARATUS, AND SUBSTRATE TREATMENT SYSTEM

(75) Inventors: Kenji Tsutsumi, Koshi (JP); Junichi Kitano, Koshi (JP); Osamu Miyahara, Koshi (JP); Hideharu Kyouda, Koshi (JP)

(73) Assignee: Tokyo Electron Limited, Tokyo (JP)

(*) Notice: Subject to any disclaimer, the term of this patent is extended or adjusted under 35 U.S.C. 154(b) by 0 days.

(21) Appl. No.: 13/161,185

(22) Filed: Jun. 15, 2011

(65) Prior Publication Data
US 2011/0240597 A1    Oct. 6, 2011

Related U.S. Application Data

(62) Division of application No. 12/015,029, filed on Jan. 16, 2008, now abandoned.

(30) Foreign Application Priority Data

Jan. 22, 2007 (JP) .................. 2007-011262

(51) Int. Cl.
*C23F 1/02* (2006.01)
(52) U.S. Cl. .......... 156/345.51; 216/87; 216/41
(58) Field of Classification Search .......... 216/41, 216/87; 156/345.51
See application file for complete search history.

(56) References Cited

U.S. PATENT DOCUMENTS

| | | | |
|---|---|---|---|
| 5,498,294 A * | 3/1996 | Matsushita et al. | 134/6 |
| 5,964,954 A * | 10/1999 | Matsukawa et al. | 134/6 |
| 6,533,864 B1 | 3/2003 | Matsuyama et al. | |
| 6,752,585 B2 * | 6/2004 | Reimer et al. | 414/783 |
| 6,929,903 B2 | 8/2005 | Itoh et al. | |
| 7,208,066 B2 | 4/2007 | Kitano et al. | |
| 7,290,948 B2 | 11/2007 | Ito | |
| 7,332,055 B2 | 2/2008 | Orii et al. | |
| 7,473,321 B2 | 1/2009 | Koga et al. | |
| 7,926,441 B2 * | 4/2011 | Tsutsumi et al. | 118/300 |

(Continued)

FOREIGN PATENT DOCUMENTS

| | | |
|---|---|---|
| JP | 61-191035 | 8/1986 |
| JP | 3-52226 | 3/1991 |
| JP | 2005-296705 | 10/2005 |

OTHER PUBLICATIONS

Office Action issued on Jun. 21, 2011 in the corresponding Japanese Patent Application No. 2007-011262 (with English Translation).

*Primary Examiner* — Sylvia R. MacArthur
(74) *Attorney, Agent, or Firm* — Oblon, Spivak, McClelland, Maier & Neustadt, L.L.P.

(57) ABSTRACT

According to the present invention, during the photolithography processing of a substrate, exposure processing is performed immediately after removal of a coating film on the rear surface of the substrate, and a coating film is formed on the rear surface of the substrate immediately after the exposure processing. Thereafter, etching treatment and so on are performed, and a series of these treatment and processing steps are performed a predetermined number of times. The coating film has been formed on the rear surface of the substrate at the time for the etching treatment, so that even if the coating film gets minute scratches, the rear surface of the substrate itself is protected by the coating film and thus never scratched. Further, since the coating film on the rear surface of the substrate is removed immediately before the exposure processing, the rear surface of the substrate can be flat for the exposure processing.

7 Claims, 22 Drawing Sheets

U.S. PATENT DOCUMENTS

2007/0099129 A1* 5/2007 Kitano et al. ................ 430/331
2007/0223342 A1  9/2007 Orii et al.
2008/0176002 A1  7/2008 Tsutsumi et al.
2009/0004607 A1* 1/2009 Shimoaoki et al. ........... 430/325
2011/0155693 A1* 6/2011 Tsutsumi et al. ............... 216/48
2011/0240597 A1* 10/2011 Tsutsumi et al. ............... 216/41

* cited by examiner

SUBSTRATE TREATMENT METHOD, COATING FILM REMOVING APPARATUS, AND SUBSTRATE TREATMENT SYSTEM

CROSS-REFERENCE TO RELATED APPLICATIONS

This application is a divisional of U.S. application Ser. No. 12/015,029 filed Jan. 16, 2008, the entire content of which is incorporated herein by reference and is based upon and claims the benefit of priority from prior Japanese Application No. 2007-011262, filed Jan. 22, 2007.

BACKGROUND OF THE INVENTION

1. Field of the Invention

The present invention relates to a method of treating a substrate, for example, a semiconductor wafer or the like, a coating film removing apparatus, and a substrate treatment system.

2. Description of the Related Art

In photolithography processing in a process of manufacturing a semiconductor device, for example, resist coating treatment of applying a resist solution above a semiconductor wafer (hereinafter, referred to as a "wafer") to form a resist film, exposure processing of exposing the resist film to light under a predetermined pattern, and developing treatment of developing the exposed resist film and so on are performed in sequence, to form a predetermined resist pattern above the wafer. Etching treatment of the wafer is performed using this resist pattern as a mask, and stripping processing of the resist film and cleaning of the wafer are then performed to form a predetermined pattern on the wafer. The process of forming a predetermined pattern in a predetermined layer is generally repeatedly performed 20 to 30 times to manufacture a semiconductor device.

Out of these treatments and processing, the above-described exposure processing is performed, for example, by applying ArF laser, KrF laser, or the like to the resist film on the wafer with the rear surface of the wafer being suction-held by a chuck in the apparatus for performing the exposure processing. If, for example, contaminants adhere to the rear surface of the wafer when the exposure processing is performed, the wafer is not horizontally held by the chuck, thus causing defocus during the exposure processing. Accordingly, it is necessary that the wafer is horizontally held by the chuck, that is, the rear surface of the wafer sucked by the chuck is flat, in order to appropriately perform the exposure processing.

Hence, a scribing apparatus including a transfer arm for inverting the front and rear surfaces of the wafer, a freely rotatable spin chuck for holding the wafer, and a scribing brush for cleaning the front and rear surfaces of the wafer held by the spin chuck has been conventionally proposed as an apparatus for removing the contaminants on the rear surface of the wafer. Conventionally, before performance of the exposure processing for the wafer, the scribing apparatus is used to first direct the rear surface of the wafer upward by means of the transfer arm and hold the wafer in this state by means of the spin chuck. The scribing brush is brought into contact with the rear surface of the wafer while rotating the spin chuck is rotating, thereby removing the contaminants adhering to the rear surface of the wafer (Japanese Patent Publication Laid-open No. Hei 3-52226).

However, even if the contaminants on the rear surface of the wafer are removed, minute scratches may be generated on the rear surface of the wafer during various kinds of treatments and processing in the process of manufacturing the wafer to cause projections and depressions on the rear surface of the wafer. Especially when the etching treatment is performed, the rear surface of the wafer is likely to get minute scratches if the surface temperatures of the wafer and the electrostatic chuck are increased during the etching treatment due to the difference in coefficient of thermal expansion between the wafer and the electrostatic chuck holding the wafer. Due to such minute scratches on the rear surface of the wafer, the wafer is not horizontally held during the exposure processing, thus causing defocus.

SUMMARY OF THE INVENTION

The present invention has been developed in consideration of the above points, and its object is to planarize the rear surface of a substrate before exposure processing in order to appropriately perform the exposure processing with the substrate being horizontally held.

To attain the above object, in the present invention, a substrate treatment method of performing at least photolithography processing and etching treatment for a substrate in this order a plurality of times, includes the steps of forming a coating film on a rear surface of the substrate after exposure processing in the photolithography processing is performed; and removing the coating film between the formation of the coating film and performance of next exposure processing.

According to the substrate treatment method of the present invention, after performance of exposure processing, the coating film is formed on the rear surface of the substrate, for example, immediately after the exposure processing, so that even if the coating film on the rear surface of the substrate gets minute scratches, for example, during the etching treatment performed after the photolithography processing and the transfer of the substrate, the rear surface of the substrate itself is protected by the coating film and thus never scratched. Since the coating film on the rear surface of the substrate is then removed before next exposure processing is performed, the rear surface of the substrate can be flat without projections and depressions in the exposure processing performed after the removal of the coating film. Accordingly, the substrate can be horizontally held during the exposure processing, so that the exposure processing can be appropriately performed. In this case, as a matter of course, the step of forming the coating film on the rear surface of the substrate may be performed before the photolithography processing for the first time is performed, and the step of removing the coating film formed before the photolithography processing for the first time may be performed before exposure processing in the photolithography processing for the first time. Thereby, even if the coating film formed on the rear surface of the substrate gets minute scratches during performance of treatment steps prior to the exposure processing performed in the photolithography processing for the first time, for example, the step of forming a resist film, and during the transfer of the substrate, the rear surface of the substrate itself is protected by the coating film and thus never scratched. In addition, since the coating film is removed before the exposure processing in photolithography processing for the first time is performed, for example, immediately before the exposure processing, the rear surface of the substrate can be flat for the exposure processing.

The method may further include the step of, immediately before the step of forming a coating film, cleaning the rear surface of the substrate. This removes the contaminants on the rear surface of the substrate immediately before a coating film is formed on the rear surface of the substrate, thereby ensuring that the coating film is planarized more reliably.

According to another aspect, the present invention is a coating film removing apparatus for removing a coating film formed on a rear surface of a substrate including a transfer arm transferring the substrate; a turning mechanism supporting the transfer arm and turning the transfer arm around a horizontal axis; a raising and lowering mechanism supporting the turning mechanism and raising and lowering the turning mechanism; a transfer mechanism supporting the raising and lowering mechanism and transferring the raising and lowering mechanism in the horizontal direction; a substrate holding unit horizontally holding the substrate with the rear surface of the substrate directed upward; and a removing solution supply nozzle supplying a removing solution for the coating film to the rear surface of the substrate held by the substrate holding unit.

According to the coating film removing apparatus of the present invention, the coating film on the rear surface of the substrate can be removed by directing the rear surface of the substrate upward by means of the transfer arm and the turning mechanism and supplying the removing solution from the removing solution supply nozzle to the rear surface of the substrate.

A rotating mechanism may be provided below the substrate holding unit for rotating the substrate holding unit around a vertical axis. The rotating mechanism rotates the substrate held by the substrate holding unit, thereby allowing the removing solution supplied on the coating film on the rear surface of the substrate to uniformly spread.

The coating film removing apparatus may be located in the same substrate treatment system with the exposure processing apparatus for performing exposure processing on the substrate. A coating film forming apparatus for forming the coating film on the rear surface of the substrate may further be located in the substrate treatment system. This ensures that the removal of the coating film on the rear surface of the substrate, the exposure processing of the substrate, and the formation of the coating film on the rear surface of the substrate can be performed in line, thus smoothly performing a series of treatment and processing of the substrate.

According to the present invention, the rear surface of the substrate can be planarized before exposure processing, thus ensuring that preferable exposure processing can be performed.

DETAILED DESCRIPTION OF THE INVENTION

Figure 1:
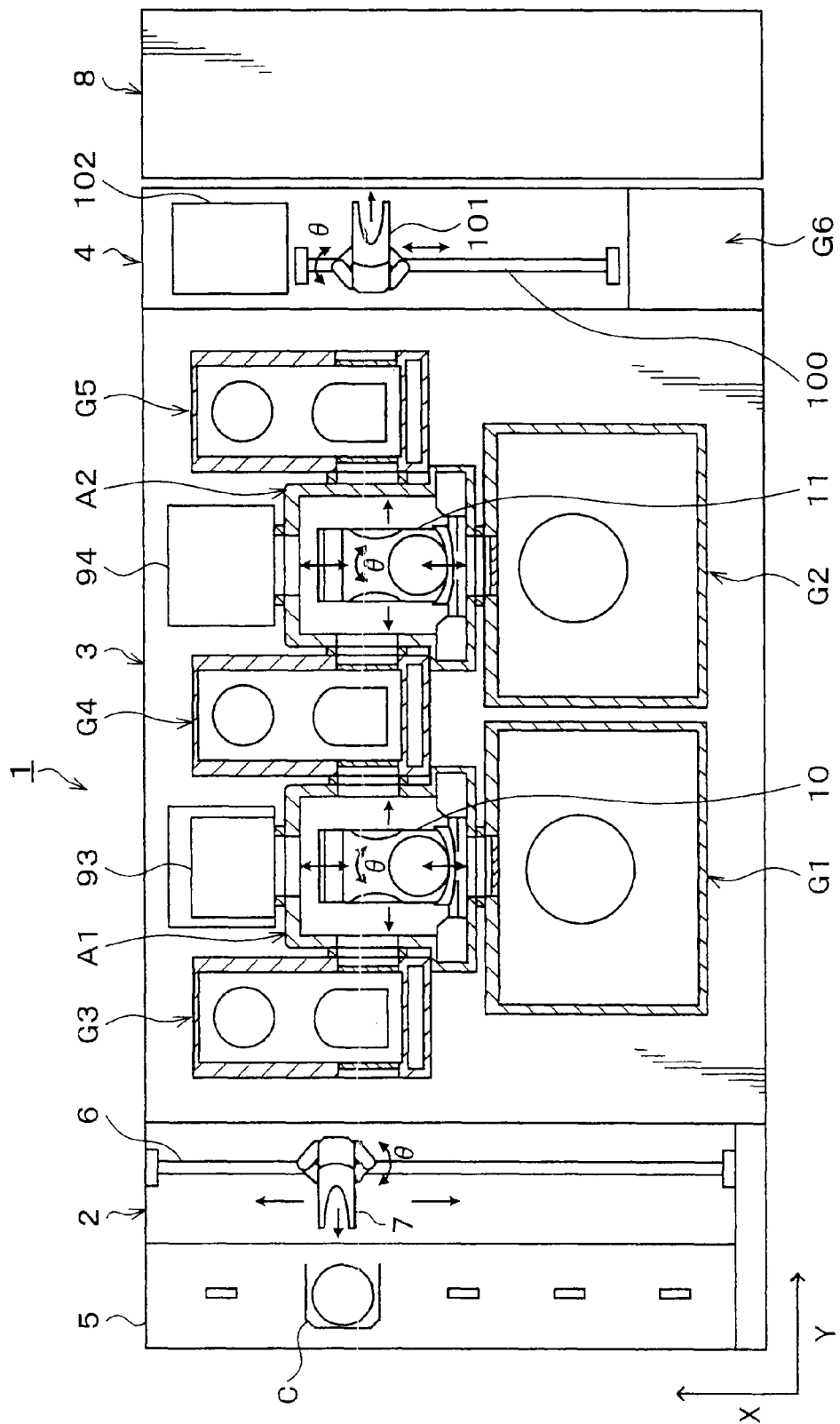
FIG. 1 is a plan view schematically showing the outline of a configuration of a coating and developing treatment system incorporating a coating film removing apparatus according to an embodiment.
Figure 2:
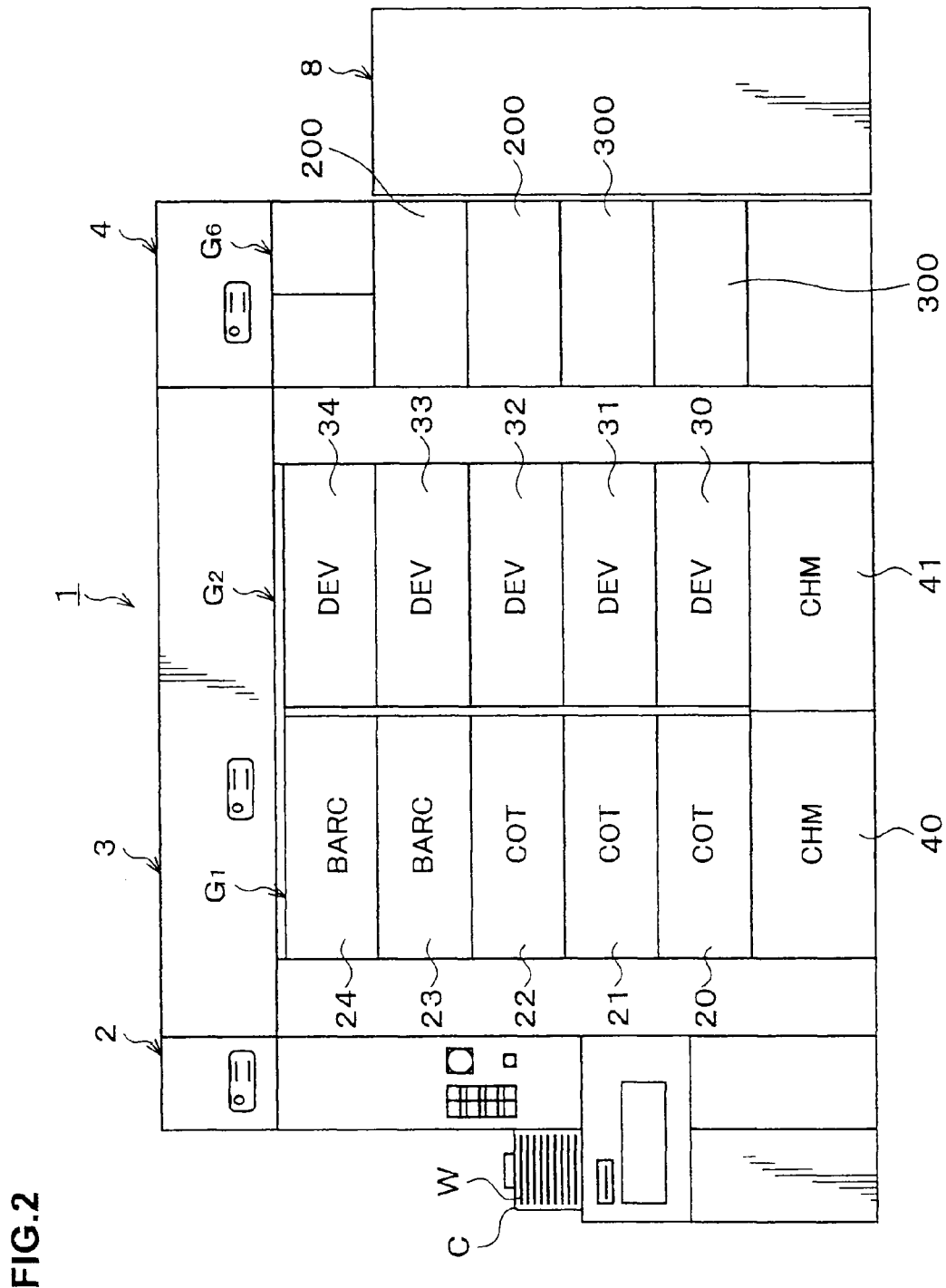
FIG. 2 is a front view of the coating and developing treatment system according to the embodiment.
Figure 3:
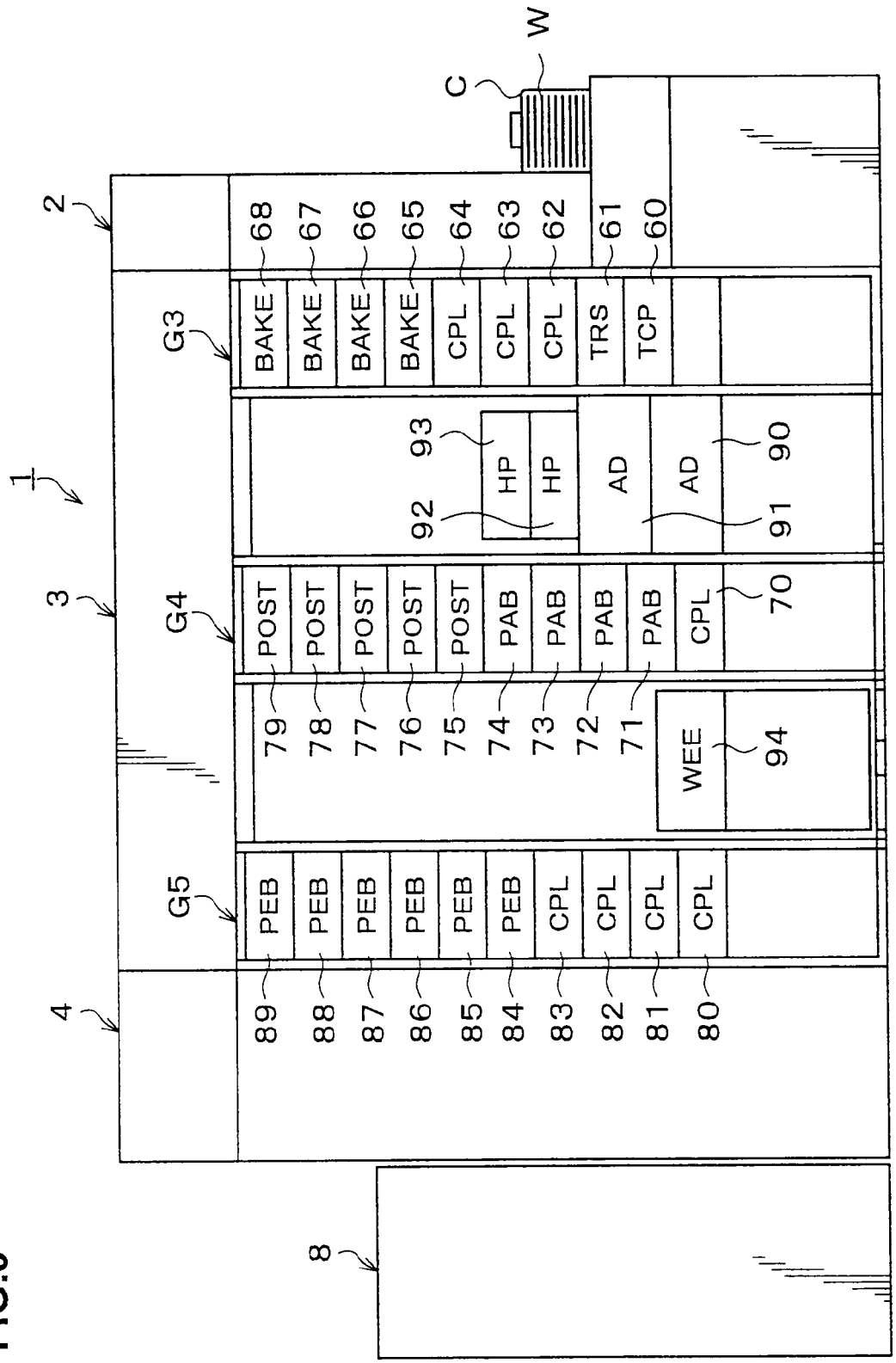
FIG. 3 is a rear view of the coating and developing treatment system according to the embodiment.

Hereinafter, a preferred embodiment of the present invention will be described. FIG. 1 is a plan view showing the outline of a configuration of a coating and developing treatment system 1 as a substrate treatment system incorporating a coating film removing apparatus 200 according to the embodiment, FIG. 2 is a front view of the coating and developing treatment system 1, and FIG. 3 is a rear view of the coating and developing treatment system 1.

The coating and developing treatment system 1 has, as shown in FIG. 1, a configuration in which, for example, a cassette station 2 for transferring 25 wafers W per cassette as a unit from/to the outside into/from the coating and developing treatment system 1 and transferring the wafers W into/out of a cassette C; a processing station 3 including a plurality of various kinds of processing and treatment units, which are multi-tiered, for performing predetermined processing or treatment in a manner of single wafer processing in the photolithography process; and an interface section 4 for delivering the wafers W to/from an exposure processing apparatus 8 provided adjacent to the processing station 3, are integrally connected.

In the cassette station 2, a cassette mounting table 5 is provided and configured such that a plurality of cassettes C can be mounted thereon in a line in an X-direction (a top-to-bottom direction in FIG. 1). In the cassette station 2, a wafer transfer body 7 is provided which is movable in the X-direction on a transfer path 6. The wafer transfer body 7 is also movable in a wafer-arrangement direction of the wafers W housed in the cassette C (a Z-direction; the vertical direction), and thus can selectively access the wafer W in each of the cassettes C arranged in the X-direction.

The wafer transfer body 7 is rotatable in a θ-direction around a Z-axis, and can access a temperature regulating unit 60 for regulating the temperature of the wafer W and a transition unit 61 for passing the wafer W included in a later-described third processing unit group G3 on the processing station 3 side.

The processing station 3 adjacent to the cassette station 2 includes, for example, five processing unit groups G1 to G5 in each of which a plurality of processing and treatment units are multi-tiered. On the side of the negative direction in the X-direction (the downward direction in FIG. 1) in the processing station 3, the first processing unit group G1 and the second processing unit group G2 are placed in order from the cassette station 2 side. On the side of the positive direction in the X-direction (the upward direction in FIG. 1) in the processing station 3, the third processing unit group G3, the fourth processing unit group G4, and the fifth processing unit group G5 are placed in order from the cassette station 2 side. Between the third processing unit group G3 and the fourth processing unit group G4, a first transfer unit A1 is provided, and a first transfer arm 10 that supports and transfers the wafer W is provided inside the first transfer unit A1. The first transfer arm 10 can selectively access the processing and treatment units in the first processing unit group G 1, the third processing unit group G3, and the fourth processing unit group G4 and transfer the wafer W to them. Between the fourth processing unit group G4 and the fifth processing unit group G5, a second transfer unit A2 is provided, and a second transfer arm 11 that supports and transfers the wafer W is provided inside the second transfer unit A2. The second transfer arm 11 can selectively access the processing and treatment units in the second processing unit group G2, the fourth processing unit group G4, and the fifth processing unit group G5 and transfer the wafer W to them.

In the first processing unit group G1, as shown in FIG. 2, solution treatment units each for supplying a predetermined liquid to the wafer W to perform treatment, for example, resist coating units 20, 21, and 22 each for applying a resist solution to the wafer W, and bottom coating unit 23 and 24 each for forming an anti-reflection film that prevents reflection of light at the time of exposure processing, are five-tiered in order from the bottom. In the second processing unit group G2, solution treatment units, for example, developing treatment units 30 to 34 each for supplying a developing solution to the wafer W to develop it are five-tiered in order from the bottom. Further, chemical chambers 40 and 41 for supplying various kinds of treatment solutions to the solution treatment units in the processing unit groups G1 and G2 are provided at the lowermost tiers of the first processing unit group G1 and the second processing unit group G2, respectively.

As shown in FIG. 3, in the third processing unit group G3, for example, the temperature regulating unit 60, the transition unit 61, high-precision temperature regulating units 62 to 64 each for regulating the temperature of the wafer W under a high precision temperature control, and high-temperature thermal processing units 65 to 68 each for heat-processing the wafer W at a high temperature, are nine-tiered in order from the bottom.

In the fourth processing unit group G4, for example, a high-precision temperature regulating unit 70, pre-baking units 71 to 74 each for heat-processing the wafer W after resist coating treatment, and post-baking units 75 to 79 each for heat-processing the wafer W after developing treatment, are ten-tiered in order from the bottom.

In the fifth processing unit group G5, a plurality of thermal processing units each for thermally processing the wafer W, for example, high-precision temperature regulating units 80 to 83, and post-exposure baking units 84 to 89, are ten-tiered in order from the bottom.

As shown in FIG. 1, on the positive direction side in the X-direction to the first transfer unit A1, a plurality of processing and treatment units are arranged, for example, adhesion units 90 and 91 each for performing hydrophobic treatment on the wafer W and heating units 92 and 93 each for heating the wafer W being four-tiered in order from the bottom as shown in FIG. 3. As shown in FIG. 1, on the positive direction side in the X-direction to the second transfer unit A2, for example, an edge exposure unit 94 is disposed which selectively exposes only the edge portion of the wafer W to light.

In the interface section 4, for example, a wafer transfer body 101 moving on a transfer path 100 extending in the X-direction, a buffer cassette 102, and a coating film processing unit group G6 are provided as shown in FIG. 1. The buffer cassette 102 is disposed on the positive direction side in the X-direction (the upward direction in FIG. 1) in the interface section 4, and the coating film processing unit group G6 is disposed on the negative direction side in the X-direction (the downward direction in FIG. 1). The wafer transfer body 101 is movable in the Z-direction and also rotatable in the θ-direction, and thus can access the exposure processing apparatus 8 adjacent to the interface section 4, the buffer cassette 102, the coating film processing unit group G6, and the fifth processing unit group G5 and transfer the wafer W to them.

As shown in FIG. 2, for example, coating film forming apparatuses 300 at two tiers each for forming a coating film on the rear surface of the wafer W and coating film removing apparatuses 200 at two tiers each for removing the coating film on the rear surface of the wafer W according to the embodiment are stacked in order from the bottom in the coating film processing unit group G6.

Next, the configuration of the above-described coating film removing apparatus 200 will be described based on FIG. 4. The coating film removing apparatus 200 has a treatment container 250 whose inside can be closed. On one side surface of the treatment container 250, a transfer-in/out port 251 for the wafer W is provided in a surface facing a transfer-in region for the wafer transfer body 101 being a transfer means for the wafer W, and an opening/closing shutter 252 is provided at the transfer-in/out port 251.

Figure 5:
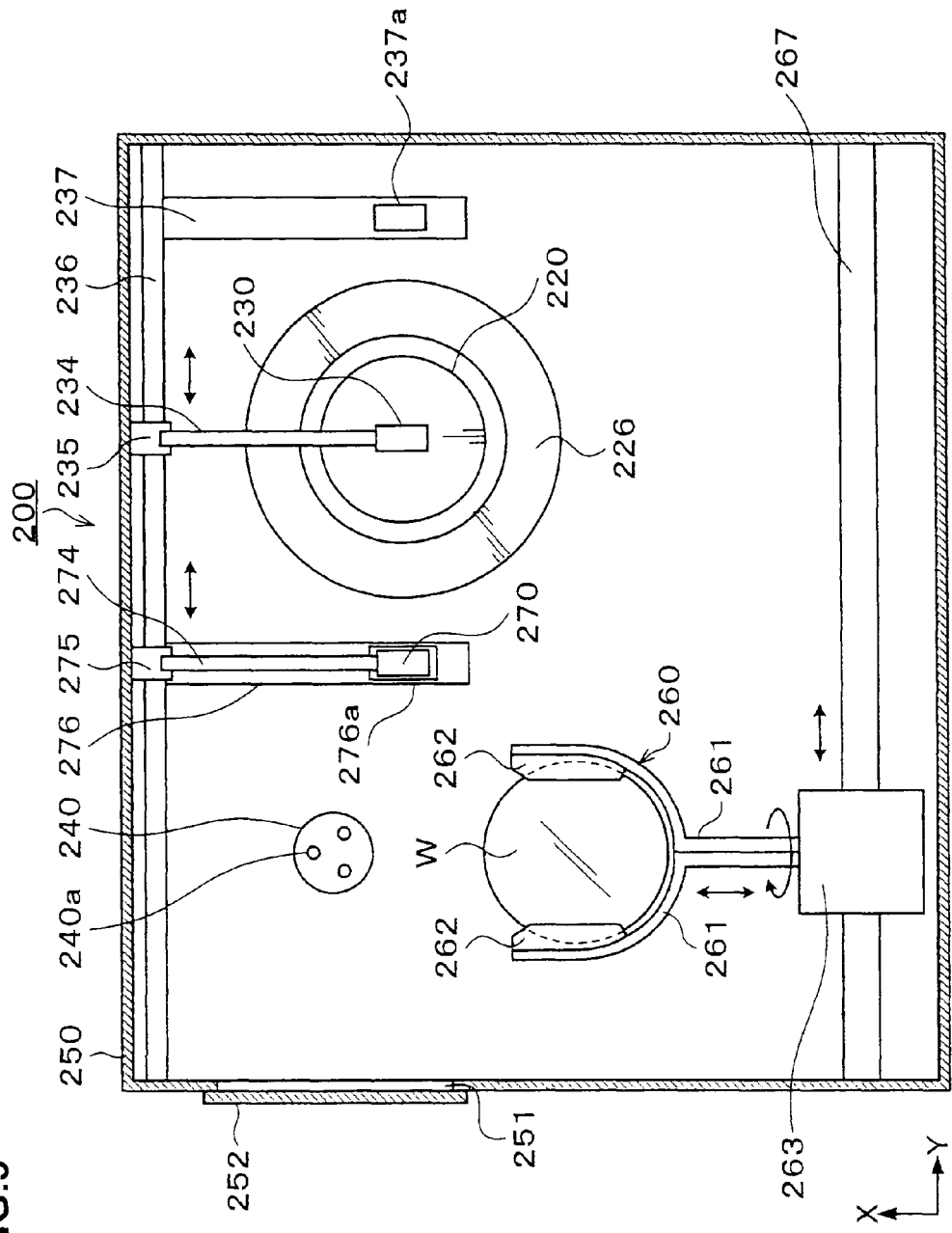
FIG. 5 is a plan view schematically showing the outline of a configuration of the coating film removing apparatus.

Inside the treatment container 250, as shown in FIG. 5, a wafer delivery table 240 for mounting the wafer W transferred thereinto through the transfer-in/out port 251. On the wafer delivery table 240, for example, three support pints 240a for supporting the wafer W are provided.

Figure 6:
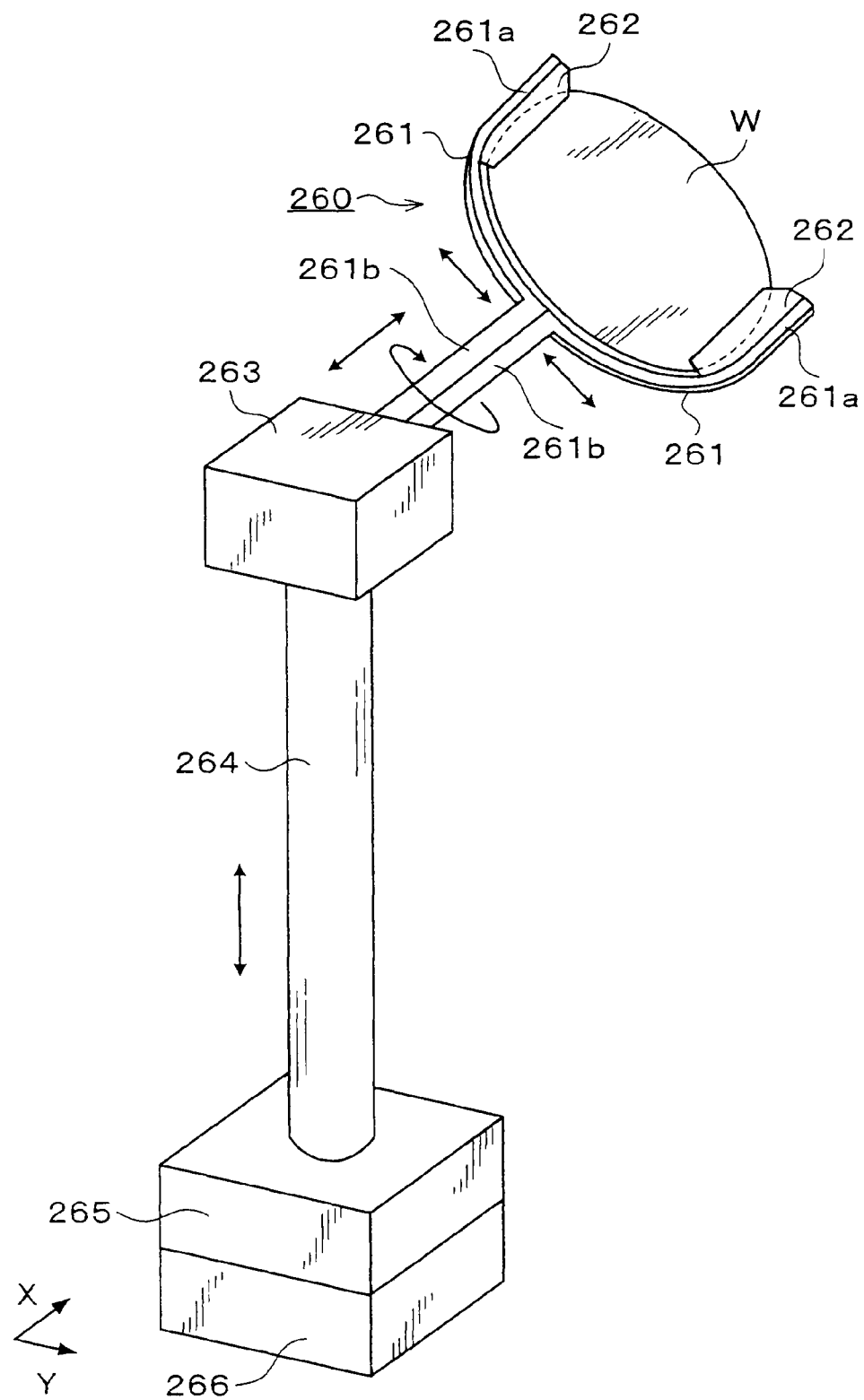
FIG. 6 is a perspective view of a transfer arm, a turning mechanism and a transfer mechanism.
Figure 7:
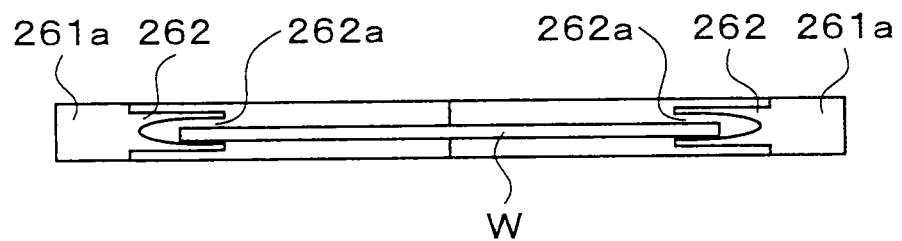
FIG. 7 is a side view of the transfer arm holding a wafer.

Inside the treatment container 250, a transfer arm 260 is provided which transfers the wafer W between the wafer delivery table 240 and a later-described spin chuck 220. The transfer 260 has a pair of chuck portions 261 capable of approaching to and separating from each other as shown in FIG. 6. The chuck portion 261 has a flame portion 261a formed in a quarter ring, and an arm portion 261b integrally formed with the flame portion 261a for supporting the flame portion 261a. The flame portions 261a are provided with respective wafer clamp portions 262, and tapered grooves 262a are formed in the side surfaces of the wafer clamp portions 262 as shown in FIG. 7. The pair of separated chuck portions 261 approach to each other, whereby peripheral portions of the wafer W are inserted into the tapered grooves 262a so that the wafer W is supported.

The transfer arm 260 is supported by a turning mechanism 263 as shown in FIG. 6. The turning mechanism 263 has a drive unit (not shown) such as a motor or the like therein, and allows the transfer arm 260 to turn around the horizontal axis (around the X-axis) and expand and contract in the horizontal direction (the X-direction). In other words, the front and rear surfaces of the wafer W held by the transfer arm 260 can be inverted, and the wafer W can be moved in the horizontal direction (the X-direction). A shaft 264 is provided on the lower surface of the turning mechanism 263, and the lower end of the shaft 264 is connected to a raising and lowering mechanism 265. The raising and lowering mechanism 265 has a drive unit (not shown) such as a motor or the like therein, and can raise and lower the turning mechanism 263 and the transfer arm 260. The raising and lowering mechanism 265 is supported by a transfer mechanism 266, and the transfer mechanism 266 allows the raising and lowering mechanism 265, the turning mechanism 263, and the transfer arm 260 to move along a guide rail 267 provided along the longitudinal direction (the Y-direction) of the treatment container 250 as shown in FIG. 5. In other words, the wafer W supported by the transfer arm 260 can be transferred in the treatment container 250.

Figure 4:
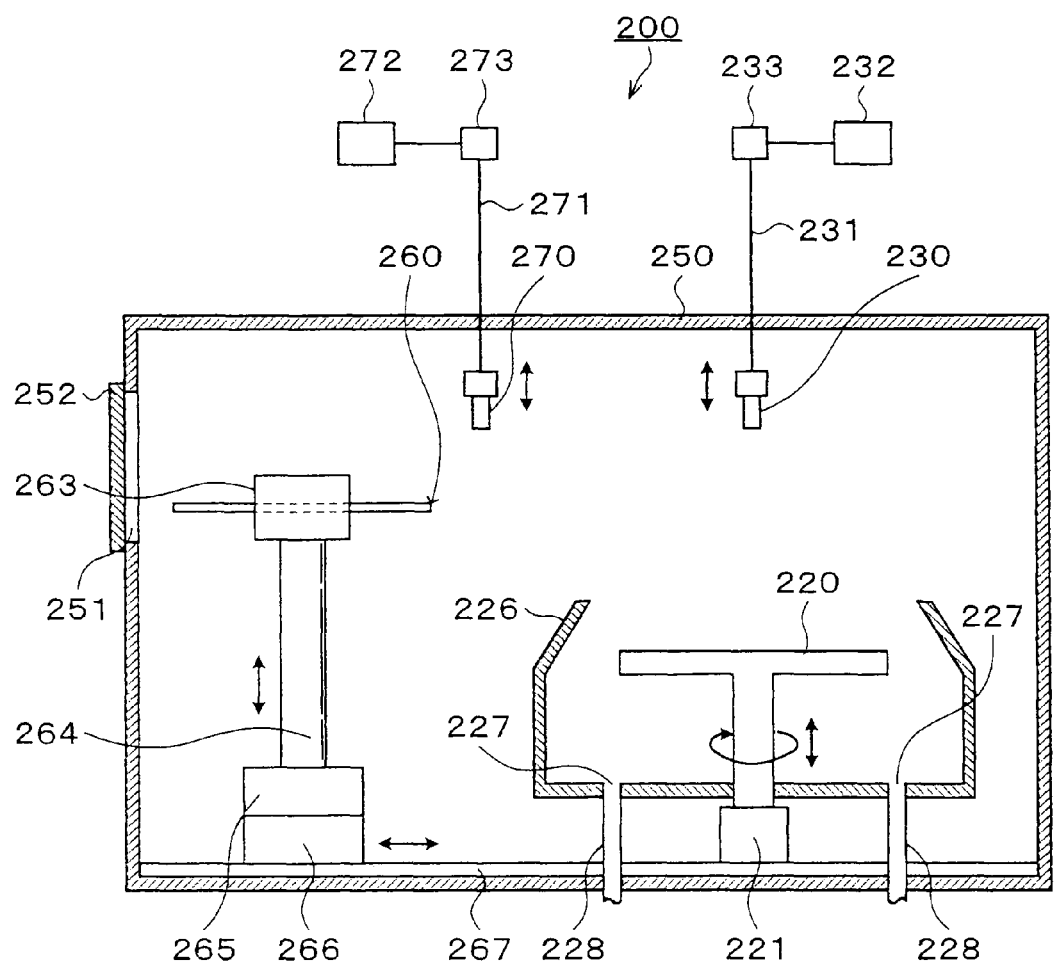
FIG. 4 is a longitudinal sectional view schematically showing the outline of a configuration of a coating film removing apparatus.
Figure 8:
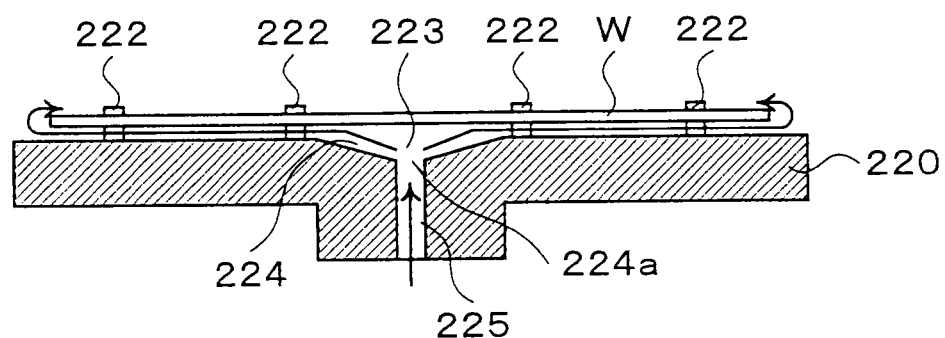
FIG. 8 is a longitudinal sectional view of a spin chuck.
Figure 9:
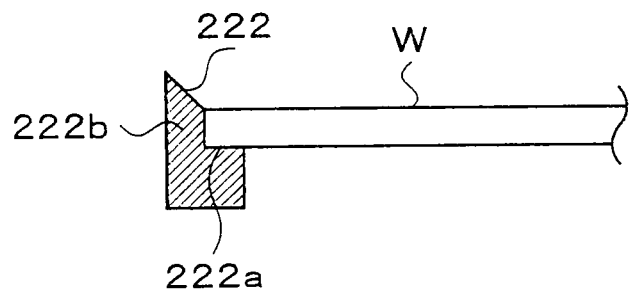
FIG. 9 is a longitudinal sectional view showing a structure of a support pin of the spin chuck.

Inside the treatment container 250, a spin chuck 220 as a substrate holding unit is provided which horizontally holds the wafer W with the rear surface of the wafer W directed upward as shown in FIG. 4. The spin chuck 220 can rotate around the vertical axis and raise and lower by means of a rotating mechanism 221 including a motor and the like. On the upper surface of the spin chuck 220, for example, eight holding pins 222 for holding the peripheral portion of the wafer W are provided along the peripheral portion of the wafer W as shown in FIG. 8. The holding pin 222 has a horizontal holding surface 222a for directly holding the wafer W and a vertical wall 222b parallel to the peripheral side edge of the wafer W as shown in FIG. 9, and the top portion of the vertical wall 222b has a height to protrude from the upper surface of the wafer W when the wafer W is held on the holding surface 222a. At the central portion of the upper surface of the spin chuck 220, a recessed portion 224 is formed downward as shown in FIG. 8, so that a space 223 is formed between the recessed portion 224 and the wafer W.

At the central portion of the upper surface of the spin chuck 220, a gas supply port 224a is formed which jets an inert gas, for example, nitrogen gas toward the space 223, and a gas supply pipe 225 penetrating through the spin chuck 220 is connected to the gas supply port 224a. The inert gas jetted from the gas supply port 224a toward the space 223 flows from the side of the lower surface of the wafer W, then around the peripheral side edge, to the upper surface. Then, the pressure of the inert gas flowing around to the side of the upper surface of the wafer W presses and fixes the wafer W onto the holding pins 222. For this technique, the publicly known technique described in JP H3-52226 can be employed.

Around the spin chuck 220, a cup body 226 is provided as shown in FIG. 4. The cup body 226 has an opening portion formed in its upper face which is larger than the wafer W and the spin chuck 220 to allow the spin chuck 220 holding the wafer W thereon to rise and lower therethrough. The bottom portion of the cup body 226 is formed with drain ports 227 for draining a coating solution or a rinse solution dropping out of the top of the wafer W, and drain pipes 228 are connected to the drain ports 227.

Above the spin chuck 220, a removing solution supply nozzle 230 is located for supplying the removing solution for removing the coating film onto the central portion of the rear surface of the wafer W as shown in FIG. 4. The removing solution supply nozzle 230 is connected to a removing solution supply source 232 via a removing solution supply pipe 231. The removing solution supply pipe 231 is provided with a supply controller 233 including a valve, a flow control unit, and so on. The removing solution supplied from the removing solution supply source 232 is selectively used depending on the kind of the coating film formed on the rear surface of the wafer W, so that, for example, when the coating film is an SOG (Spin On Glass) film, a treatment solution such as hydrofluoric acid is used as the removing solution. Besides, when the coating film is, for example, a resist film of an organic material, PGMEA or the like, or acetone-based or ketone-based solvent is used as the removing solution.

The removing solution supply nozzle 230 is connected to a moving mechanism 235 via an arm 234 as shown in FIG. 5. The arm 234 is configured such that it can be moved by the moving mechanism 235 along a guide rail 236 provided along the longitudinal direction (the Y-direction) of the treatment container 250, from a waiting region 237 provided outside on the side of one end of the cup body 226 (the right side in FIG. 5) toward the other end side and vertically moved. The waiting region 237 is configured to be able to accommodate the removing solution supply nozzle 230 and includes a cleaning portion 237a which can clean the tip end portion of the removing solution supply nozzle 230.

Above the spin chuck 220, a rinse nozzle 270 is located for cleaning the rear surface of the wafer W after the coating film is removed as shown in FIG. 4. The rinse nozzle 270 is connected to a rinse solution supply source 272 via a rinse solution supply pipe 271. The rinse solution supply pipe 271 is provided with a supply controller 273 including a valve, a flow control unit, and so on. As the rinse solution supplied from the rinse solution supply source 272, for example, pure water is used.

An arm 274 and a moving mechanism 275 connected to the rinse nozzle 270 have the same configuration as those of the arm 234 and the moving mechanism 235 as shown in FIG. 5. The moving mechanism 275 of the rinse nozzle 270 and the moving mechanism 235 of the removing solution supply nozzle 230 share the guide rail 236. The arm 274 of the rinse nozzle 270 is configured such that it can be moved by the moving mechanism 275 along the guide rail 236, from a waiting region 276 provided outside on the side of one end of the cup body 226 (the left side in FIG. 5) toward the other end side and vertically moved. The waiting region 276 is configured to be able to accommodate the rinse nozzle 270 and includes a cleaning portion 276a which can clean the tip end portion of the rinse nozzle 270.

Next, the configuration of the above-described coating film forming apparatus 300 will be described based on FIG. 10. The coating film forming apparatus 300 has a treatment container 350 whose inside can be closed. On one side surface of the treatment container 350, a transfer-in/out port 351 for the wafer W is provided in a surface facing a transfer-in region for the wafer transfer body 101 being a transfer means for the wafer W, and an opening/closing shutter 352 is provided at the transfer-in/out port 351. Inside the treatment container 350, a partition member 353 is provided that partitions the inside of the treatment container 350 into a first treatment chamber 311 and a second treatment chamber 312, and the insides of the first treatment chamber 311 and the second treatment chamber 312 are closable, respectively. The partition member 353 is formed with a passing port 354 through which a later-described transfer arm 360, turning mechanism 363, raising and lowering mechanism 365, and transfer mechanism 366 can pass, and an opening and closing shutter 355 is provided at the passing port 354.

Inside the first treatment chamber 311, a wafer delivery table 340 is provided for mounting the wafer W transferred thereinto through a transfer-in/out port 351 as shown in FIG.

11. On the wafer delivery table 340, for example, three support pints 340a for supporting the wafer W are provided.

Inside the coating film forming apparatus 300, a transfer arm 360 is provided which receives the wafer W from the wafer delivery table 340 and transfers the wafer W between the first treatment chamber 311 and the second treatment chamber 312. The transfer arm 360 has the same configuration as that of the transfer arm 260 in the coating film removing apparatus 200 and thus can hold the wafer W.

The turning mechanism 363 for supporting the transfer arm 360, a shaft 364 connected to the lower surface of the turning mechanism 363, the raising and lowering mechanism 365 connected to the lower end portion of the shaft 364, and the transfer mechanism 366 for supporting the raising and lowering mechanism 365 have the same configurations as those of the turning mechanism 263, the shaft 264, the raising and lowering mechanism 265, and the transfer mechanism 266 in the coating film removing apparatus 200, and thus can invert the front and rear surfaces of the wafer W held by the transfer arm 360, and move the wafer W in the horizontal direction (the X-direction) and raise and lower the wafer W.

Figure 11:
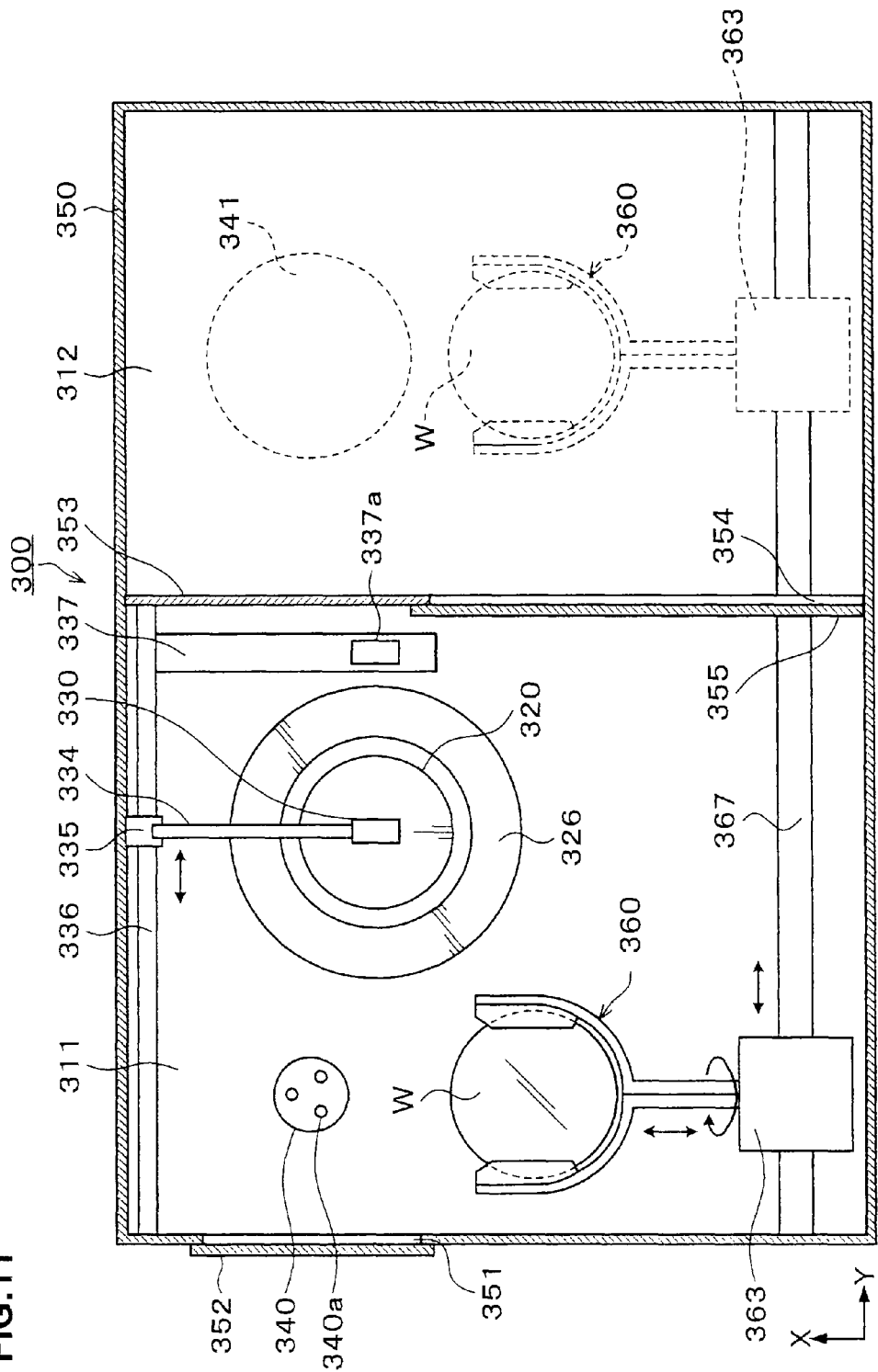
FIG. 11 is a plan view schematically showing the outline of a configuration of the coating film forming apparatus.

A guide rail 367 on which the transfer mechanism 366 moves is provided along the longitudinal direction (the Y-direction) of the treatment container 350 as shown in FIG. 11 to allow the wafer W supported by the transfer arm 360 to be transferred between the first treatment chamber 311 and the second treatment chamber 312.

Figure 10:
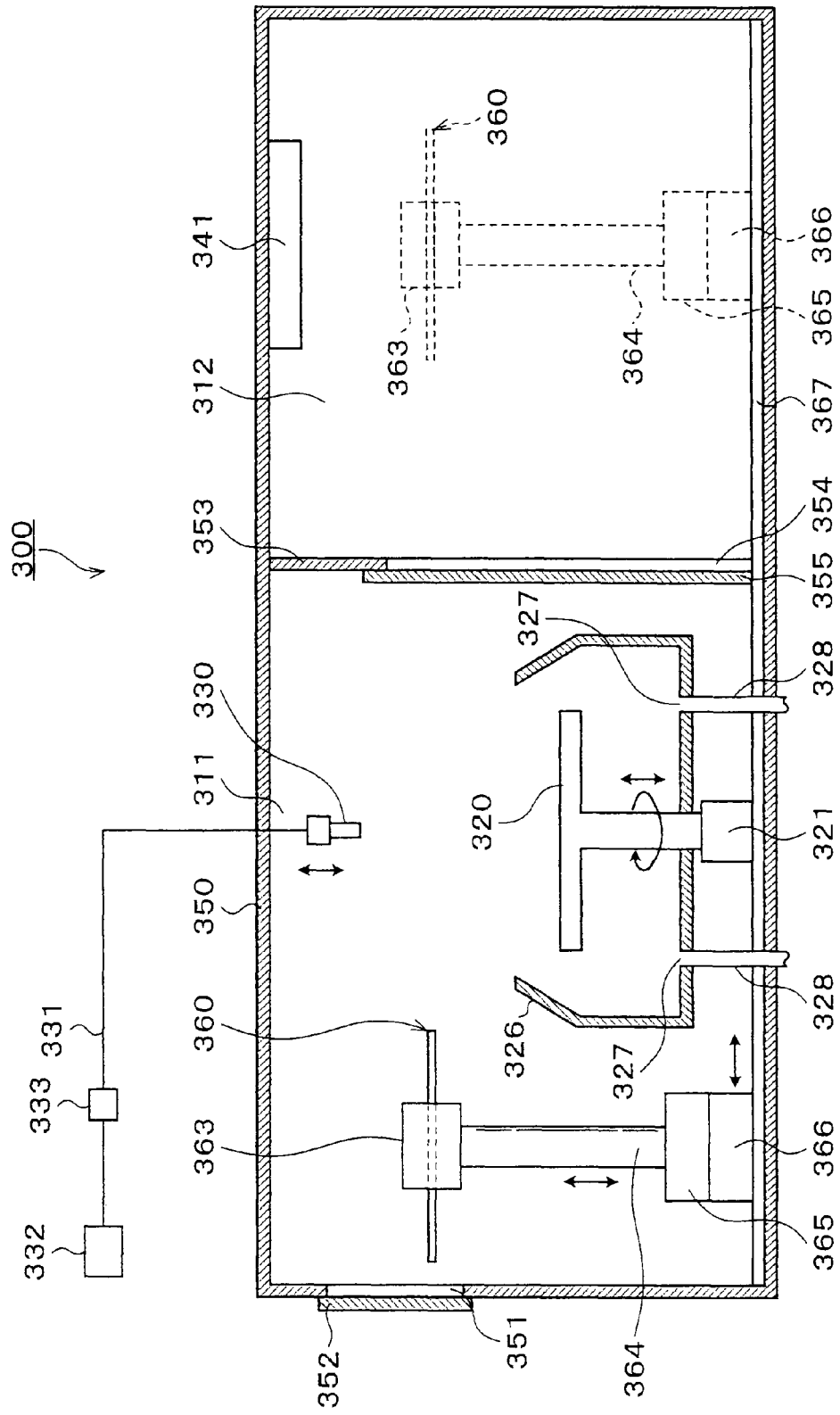
FIG. 10 is a longitudinal sectional view schematically showing the outline of a configuration of a coating film forming apparatus.

Inside the first treatment chamber 311, a spin chuck 320 is provided which horizontally holds the wafer W with the rear surface of the wafer W directed upward as shown in FIG. 10. The spin chuck 320 has the same configuration as that of the spin chuck 220 in the coating film removing apparatus 200 and can be rotated around the vertical axis and raised and lowered by a rotating mechanism 321, and the wafer W can be fixed to the spin chuck 320 with the rear surface of the wafer W directed upward.

A cup body 326 provided around the spin chuck 320, drain ports 327 provided in the bottom portion of the cup body 326, drain pipes 328 connected to the drain ports 327 have the same configurations as those of the cup body 226, the drain ports 227, and the drain pipes 228 in the coating film removing apparatus 200.

Above the spin chuck 320, a coating nozzle 330 is located for supplying a coating solution onto the central portion of the rear surface of the wafer W. The coating nozzle 330 is connected to a coating solution supply source 332 via a coating solution supply pipe 331. The coating solution supply pipe 331 is provided with a supply controller 333 including a valve, a flow control unit, and so on. As the coating solution supplied from the coating solution supply source 332, for example, SOG material, or a resist of an organic material or the like is used.

The coating nozzle 330 is connected to a moving mechanism 335 via an arm 334 as shown in FIG. 11. The arm 334 is configured such that it can be moved by the moving mechanism 335 along a guide rail 336 provided along the Y-direction of the first treatment chamber 311, from a waiting region 337 provided outside on the side of one end of the cup body 326 (the right side in FIG. 11) toward the other end side and vertically moved. The waiting region 337 is configured to be able to accommodate the coating nozzle 330 and includes a cleaning portion 337a which can clean the tip end portion of the coating nozzle 330.

In an upper portion of the second treatment chamber 312, a lamp heating unit 341 is provided which cures the coating solution applied on the wafer W as shown in FIG. 10. The lamp heating unit 341 can cure the coating solution on the wafer W by heating the wafer W.

Figure 12:
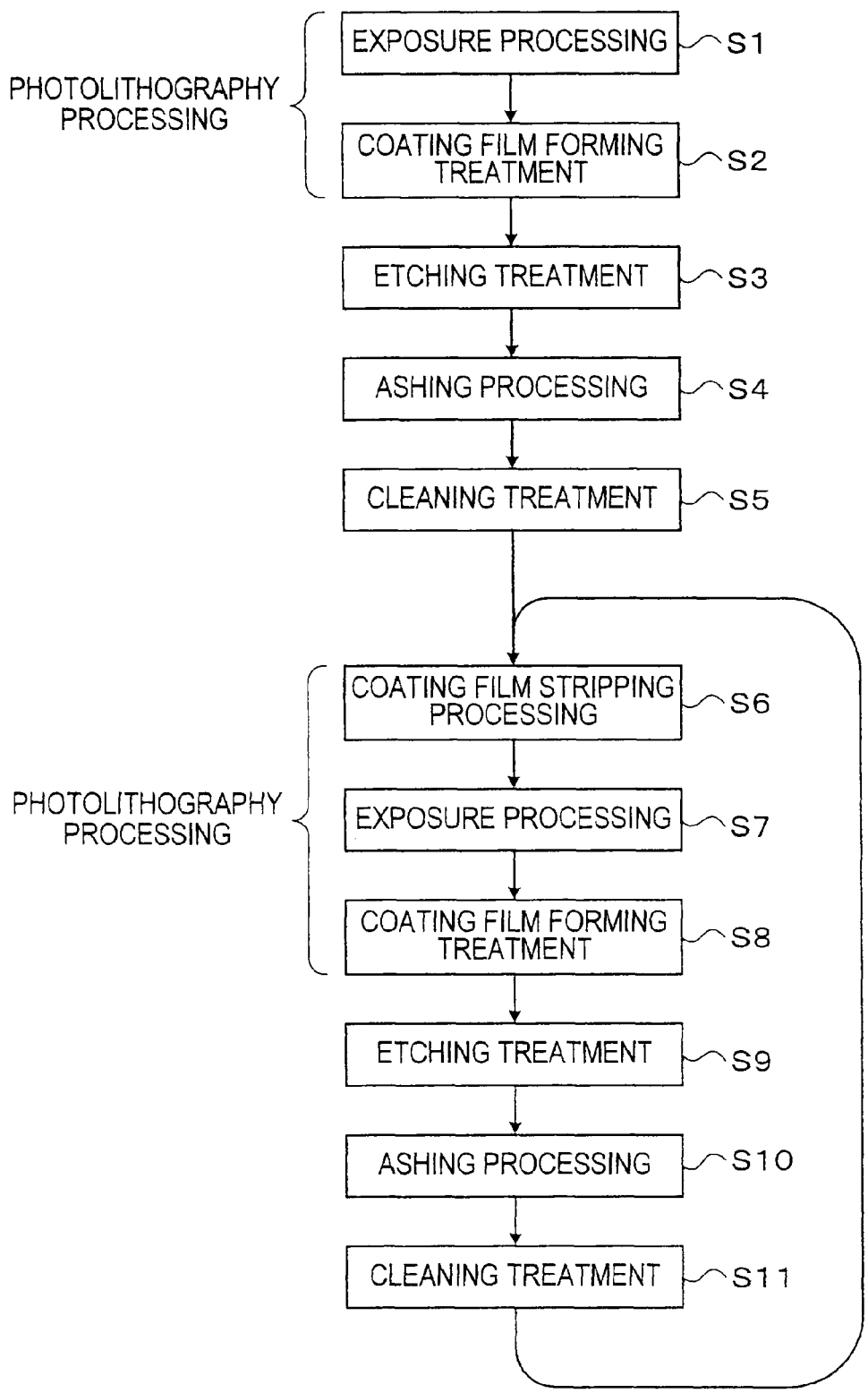
FIG. 12 is a flow showing a procedure of wafer treatment.

The coating and developing treatment system 1 incorporating the coating film removing apparatus 200 according to this embodiment is configured as described above, and the photolithography processing and various kinds of treatments performed on the wafer W after completion of the photolithography processing which are performed in this coating and developing treatment system 1 will be described next. FIG. 12 is a flow showing the procedure of the wafer treatment.

First of all, one wafer W is taken out of the cassette C on the cassette mounting table 5 by the wafer transfer body 7 and transferred to the temperature regulating unit 60 in the third processing unit group G3. The wafer W transferred to the temperature regulating unit 60 is temperature-regulated to a predetermined temperature and is then transferred by the first transfer arm 10 into bottom coating unit 23, where an anti-reflection film is formed. The wafer W above which the anti-reflection film has been formed is transferred by the first transfer arm 10 to the heating unit 92, the high-temperature thermal processing unit 65, and the high-precision temperature regulating unit 70 in sequence so that predetermined processing is performed in each of the units. Thereafter, the wafer W is transferred to the resist coating unit 20.

After a resist film has been formed over the front surface of the wafer W in the resist coating unit 20, the wafer W is transferred by the first transfer arm 10 to the pre-baking unit 71 and subjected to heating processing and subsequently transferred by the second transfer arm 11 to the edge exposure unit 94 and the high-precision temperature regulating unit 83 in sequence so that the wafer W is subjected to predetermined processing in each of the units. Thereafter, the wafer W is transferred by the wafer transfer body 101 in the interface section 4 to the exposure processing apparatus 8. In the exposure processing apparatus 8, the rear surface of the wafer W is suction-held, and the resist film above the wafer W is exposed to light under a predetermined pattern (Step S1 in FIG. 12). The wafer W for which exposure processing has been finished is transferred by the wafer transfer body 101 to the coating film forming apparatus 300 (Step S2 in FIG. 12).

The wafer W transferred into the treatment container 350 through its transfer-in/out port 351 is mounted on the wafer delivery table 340 by the wafer transfer body 101. Then, the turning mechanism 363 extends the transfer arm 360 to a position of the wafer delivery table 340 so that the transfer arm 360 holds the wafer W.

The turning mechanism 363 then turns and inverts the wafer W held by the transfer arm 360 to direct the rear surface of the wafer W upward. In this state, the transfer mechanism 366 moves the wafer W to above the spin chuck 320. The spin chuck 320 is then raised to pass the wafer W from the transfer arm 360 to the spin chuck 320. The transfer arm 360 is retracted from above the spin chuck 320 and the inert gas is jetted from the gas supply port 324 of the spin chuck 320, whereby the wafer W is horizontally held on the spin chuck 320. The spin chuck 320 is then lowered to lower the wafer W to a predetermined position.

Subsequently, the rotating mechanism 321 rotates the wafer W, and the coating nozzle 330 is moved to above the central portion of the wafer W. The coating solution is discharged from the coating nozzle 330 to the central portion of the rear surface of the wafer W. The discharged coating solution spreads over the rear surface of the wafer W by the centrifugal force generated by rotation of the wafer W. Thereafter, the coating nozzle 330 is moved from above the central portion of the wafer W to the waiting region 337. Note that the coating solution may be applied within a range where the rear surface of the wafer W is sucked in the exposure processing apparatus 8, and the coating solution may not be applied at the peripheral portion of the rear surface of the wafer W.

After spread of the coating solution on the rear surface of the wafer W, the wafer W on the spin chuck 320 is raised to a predetermined position, and the transfer arm 360 is extended to move to above the spin chuck 320. The wafer W is passed from the spin chuck 320 to the transfer arm 360.

Next, the transfer mechanism 366 moves the wafer W into the second treatment chamber 312. The turning mechanism 363, the raising and lowering mechanism 365, and the transfer mechanism 366 adjust the position of the wafer W so that the wafer W is located directly below the lamp heating unit 341 as shown by broken line portions in FIG. 10 and FIG. 11. Then, with the wafer W being held by the transfer arm 360, the lamp heating unit 341 heats the wafer W to cure the coating solution on the rear surface of the wafer W.

After formation of the coating film by curing the coating solution on the rear surface of the wafer W, the transfer mechanism 366 moves again the wafer W into the first treatment chamber 311. The turning mechanism 363 then turns and inverts the wafer W to direct the front surface of the wafer W upward, and the wafer W is passed from the transfer arm 360 to the wafer delivery table 340. The wafer W is then transferred by the wafer transfer body 101 to the outside of the coating film forming apparatus 300.

The wafer W having the coating film formed on its rear surface is transferred by the wafer transfer body 101, for example, to the post-exposure baking unit 84, where the wafer W is subjected to predetermined processing. After completion of the thermal processing in the post-exposure baking unit 84, the wafer W is transferred by the second transfer arm 11 to the high-precision temperature regulating unit 81, where the wafer W is temperature-regulated, and then transferred to the developing treatment unit 30, where developing treatment is performed on the wafer W so that a pattern is formed in the resist film. The wafer W is then transferred by the second transfer arm 11 to the post-baking unit 75, where the wafer W is subjected to heating processing, and subsequently transferred to the high-precision temperature regulating unit 63, where the wafer W is temperature-regulated. The wafer W is then transferred by the first transfer arm 10 to the transition unit 61, and returned by the wafer transfer body 7 to the cassette C, with which a series of photolithography process ends.

After the photolithography processing is performed on the wafer W in this manner (Steps S1 and S2 in FIG. 12), etching treatment is performed to selectively etch the thin film on the wafer W using the pattern formed in the resist film above the wafer W as a mask (Step S3 in FIG. 12). Then, ashing processing of stripping the resist film remaining above the wafer W, for example, by generating plasma is performed (Step S4 in FIG. 12), and cleaning treatment of removing contaminants such as metal and organic substance adhering onto the wafer W is then performed (Step S5 in FIG. 12).

Thereafter, the wafer W is transferred into the coating and developing treatment system 1 so that the wafer W is subjected to the photolithography processing for the second time. The wafer W transferred in the interface section 4 after the wafer W is subjected to above-described predetermined treatment and processing such as the above-described formation of the resist film and so on in the coating and developing treatment system 1 is transferred by the wafer transfer body 101 to the coating film removing apparatus 200 in order to remove the coating film on the rear surface of the wafer W before the wafer W is transferred to the exposure processing apparatus 8 (Step S6 in FIG. 12).

The wafer W transferred by the wafer transfer body 101 into the treatment container 250 is mounted on the wafer delivery table 240. The turning mechanism 263 then extends the transfer arm 260 to a position of the wafer delivery table 240 so that the transfer arm 260 holds the wafer W.

The turning mechanism 263 then turns and inverts the wafer W held by the transfer arm 260 to direct the rear surface of the wafer W upward. In this state, the transfer mechanism 266 moves the wafer W to above the spin chuck 220. The spin chuck 220 is then raised to pass the wafer W from the transfer arm 260 to the spin chuck 220. The transfer arm 260 is retracted from above the spin chuck 260 and the inert gas is jetted from the gas supply port 224*a* of the spin chuck 220, whereby the wafer W is horizontally held on the spin chuck 220. The spin chuck 220 is then lowered to lower the wafer W to a predetermined position.

Subsequently, the rotating mechanism 221 rotates the wafer W, and the removing solution supply nozzle 230 is moved to above the central portion of the wafer W. The removing solution is discharged from the removing solution supply nozzle 230 to the central portion of the rear surface of the wafer W. The discharged removing solution spreads over the rear surface of the wafer W by the centrifugal force generated by rotation of the wafer W to remove the coating film on the rear surface of the wafer W. Thereafter, the removing solution supply nozzle 230 is moved from above the central portion of the wafer W to the waiting region 237.

After removal of the coating film existing on the rear surface of the wafer W, the rinse nozzle 270 is moved to above the central portion of the wafer W so that the rinse solution is discharged from the rinse nozzle 270 to the central portion of the rear surface of the wafer W. The discharged rinse solution spreads on the rear surface of the wafer W by the centrifugal force to clean the rear surface of the wafer W.

After completion of the cleaning of the rear surface of the wafer W, the wafer W on the spin chuck 220 is raised to a predetermined position, and the transfer arm 260 is extended to move to above the spin chuck 220. The wafer W is passed from the spin chuck 220 to the transfer arm 260. The turning mechanism 263 then turns and inverts the wafer W to direct the front surface of the wafer W upward, and the wafer W is passed from the transfer arm 260 to the wafer delivery table 240. The wafer W is then transferred by the wafer transfer body 101 to the outside of the coating film removing apparatus 200.

The wafer W having the coating film on its rear surface removed is transferred by the wafer transfer body 101 to the exposure processing apparatus 8, where the resist film above the wafer W is exposed to light under a predetermined pattern (Step S7 in FIG. 12). The wafer W for which the exposure processing has been finished is transferred by the wafer transfer body 101 to the coating film forming apparatus 300, where the coating film is formed on the rear surface of the wafer W (Step S8 in FIG. 12). Thereafter, treatments such as the development of the resist film and so on are performed, with which the photolithography processing ends.

After performance of the photolithography processing for the second time is performed on the wafer W, etching treatment for the second time (Step S9 in FIG. 12), ashing processing for the second time (Step S10 in FIG. 12), and cleaning treatment for the second time (Step S11 in FIG. 12) are performed in sequence. The photolithography processing, etching treatment, ashing processing, and cleaning treatment (Steps S6 to S11 in FIG. 12) are performed in this order a predetermined number of times, whereby multilayer patterns are formed above the wafer W, with which a series of treatment and processing of wafer W ends.

According to the above embodiment, the coating film is formed on the rear surface of the wafer W in the coating film forming apparatus 300 immediately after the exposure processing for the wafer W is performed in the exposure processing apparatus 8, so that even if the coating film on the rear surface of the wafer W gets minute scratches during the etching treatment and the transfer of the wafer W before reaching the exposure processing apparatus 8, the rear surface of the wafer W itself is protected by the coating film and thus never scratched. In the photolithography processing subsequently performed, the coating film on the rear surface of the wafer W is removed in the coating film removing apparatus 200 immediately before the exposure processing is performed in the exposure processing apparatus 8, so that the rear surface of the wafer W can be flat without projections and depressions for the exposure processing. Therefore, the wafer W can be horizontally held during the exposure processing to allow the exposure processing to be appropriately performed.

Planarizing the rear surface of the wafer W before the exposure of the pattern is particularly effective in the case of performing double patterning processing that is used for forming a fine pattern on the wafer W. In the double patterning processing, the pattern to be formed in a fine layer on the wafer W is subjected to exposure processing in twice in which the etching treatment is performed after the exposure processing for the first time and the exposure processing for the second time is performed on the same layer. When the coating and developing treatment system 1 according to this embodiment is used for the double patterning processing, the coating film is formed on the rear surface of the wafer W immediately after the exposure processing for the first time and the coating film is removed immediately before the exposure processing for the second time, whereby the rear surface of the wafer W can be protected by the coating film during the etching treatment and the transfer of the wafer W, so that the rear surface of the wafer W can be flat for the exposure processing. Accordingly, the exposure processing in the double patterning processing can be appropriately performed.

Since the coating film forming apparatus 300 and the coating film removing apparatus 200 are provided in the coating and developing treatment system 1, the formation of the coating film on the rear surface of the wafer W and the removal of the coating film can be performed in line, thus smoothly performing a series of wafer treatment.

Figure 13:
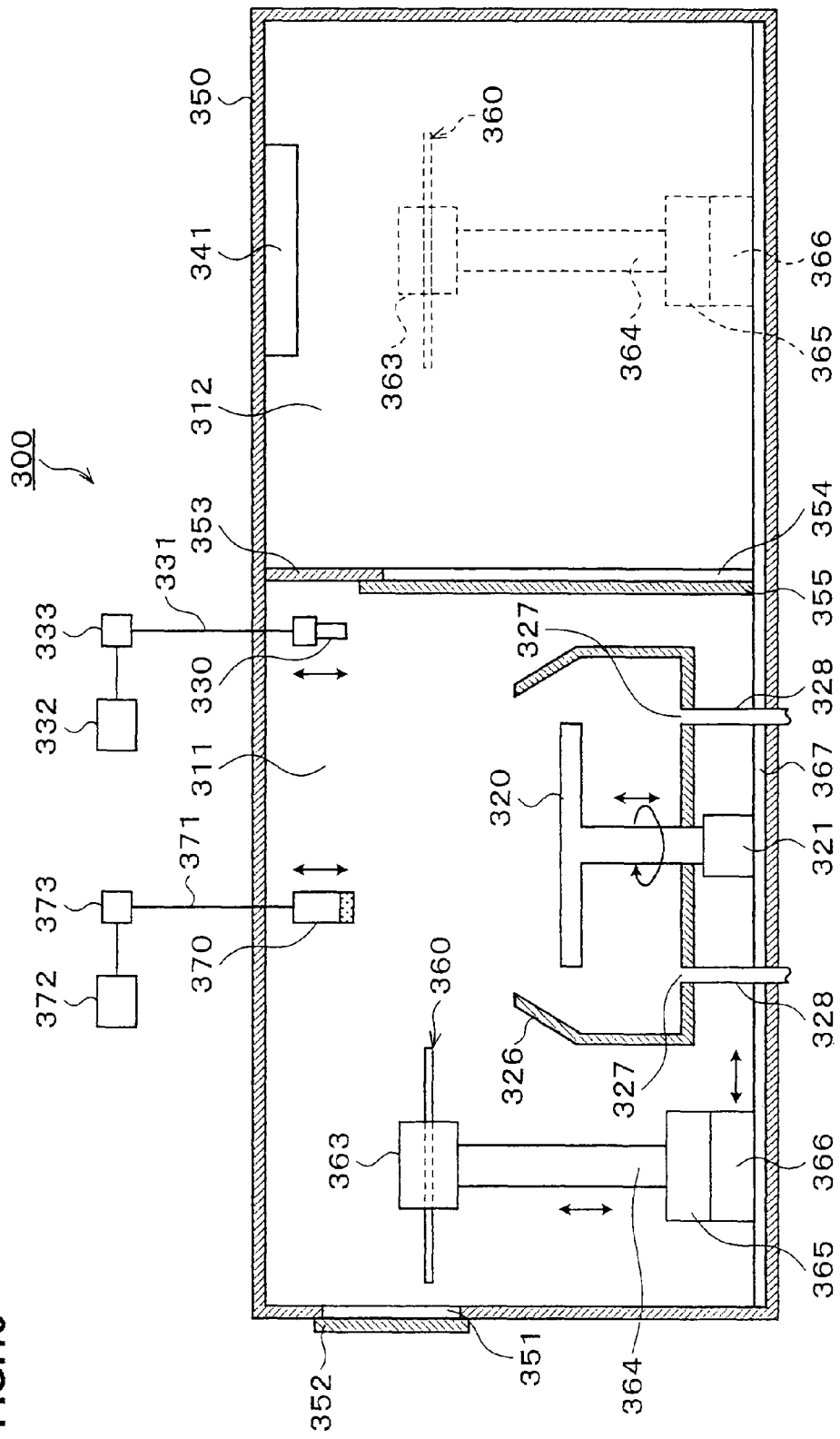
FIG. 13 is a longitudinal sectional view schematically showing the outline of a configuration of a coating film forming apparatus.

In the first treatment chamber 311 of the coating film forming apparatus 300 of the above embodiment, a scribing brush 370 for cleaning the rear surface of the wafer W may further be provided as shown in FIG. 13. The scribing brush 370 is located above the spin chuck 320. A cleaning solution supply port (not shown) is formed in the lower surface of the scribing brush 370, and is connected to a cleaning solution supply source 372 via a cleaning solution supply pipe 371. The cleaning solution supply pipe 371 is also provided with a supply controller 373 including a valve, a flow control unit, and so on.

Figure 14:
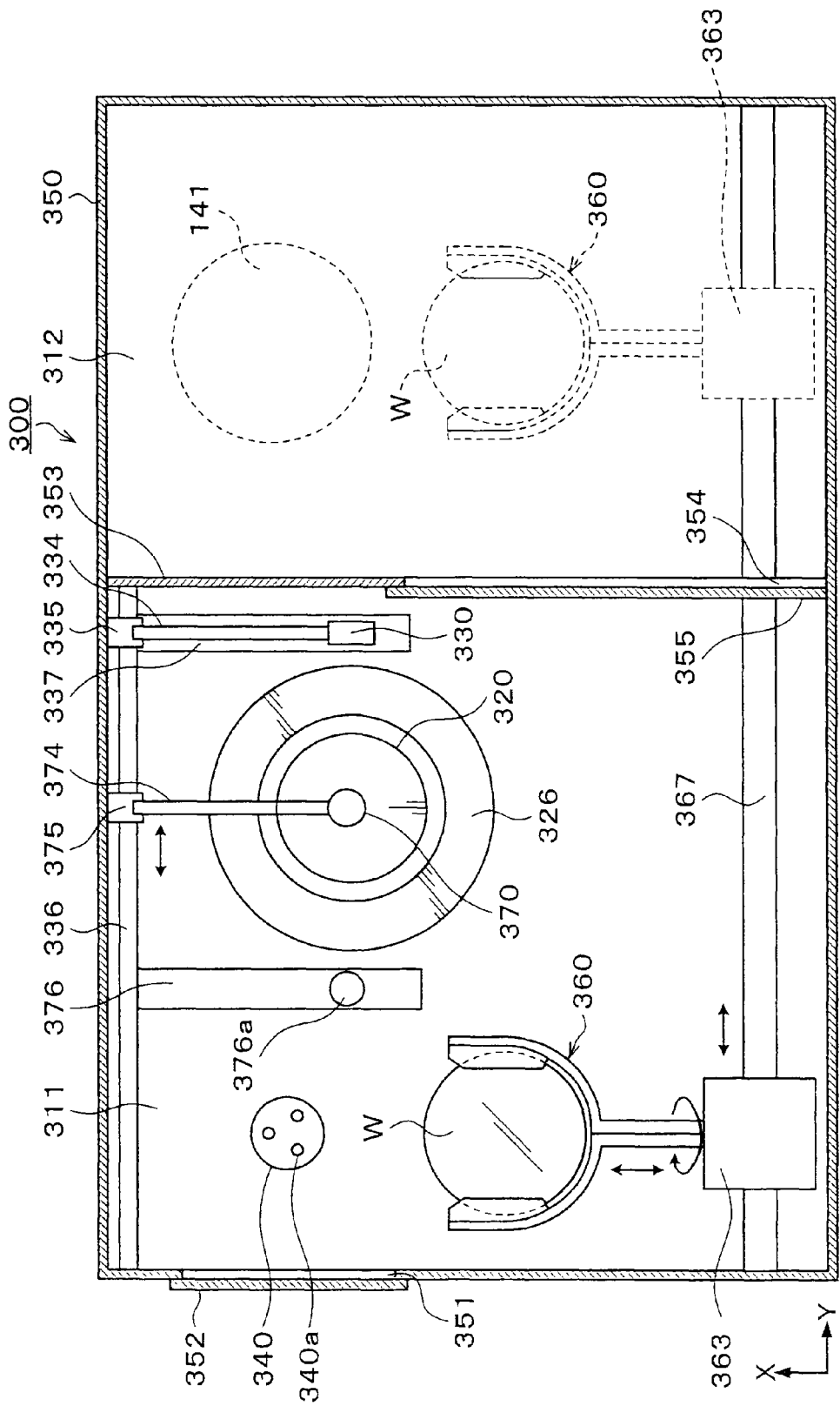
FIG. 14 is a plan view schematically showing the outline of a configuration of the coating film forming apparatus.

The scribing brush 370 is connected to a moving mechanism 375 via an arm 374 as shown in FIG. 14. The moving mechanism 375 of the scribing brush 370 and the moving mechanism 335 of the coating nozzle 330 share the guide rail 336. The arm 374 of the scribing brush 370 is configured such that it can be moved by the moving mechanism 375 along the guide rail 336, from a waiting region 376 provided outside on the side of one end of the cup body 326 (the left side in FIG. 14) toward the other end side and vertically moved. The waiting region 376 is configured to be able to accommodate the scribing brush 370 and includes a cleaning portion 376a which can clean the tip end portion of the scribing brush 370.

In this case, after the wafer W is passed from the transfer arm 360 to the spin chuck 320, the wafer W is rotated by the rotating mechanism 321 and the scribing brush 370 is brought into contact with the rear surface of the wafer W. Thereafter, the rear surface of the wafer W is cleaned while the cleaning solution is being supplied from the cleaning solution supply port of the scribing brush 370. After the contaminants adhering to the rear surface of the wafer W are removed in the above manner, the scribing brush 370 is moved from above the wafer W to the waiting region 376. The coating nozzle 330 is moved to above the wafer W and applies the coating solution to the rear surface of the wafer W. The contaminants adhering to the rear surface of the wafer W are removed by the scribing brush 370 immediately before the coating solution is applied from the coating nozzle 330 to the rear surface of the wafer W, thereby ensuring that a coating film to be formed on the rear surface of the wafer W thereafter is planarized more reliably.

Figure 15:
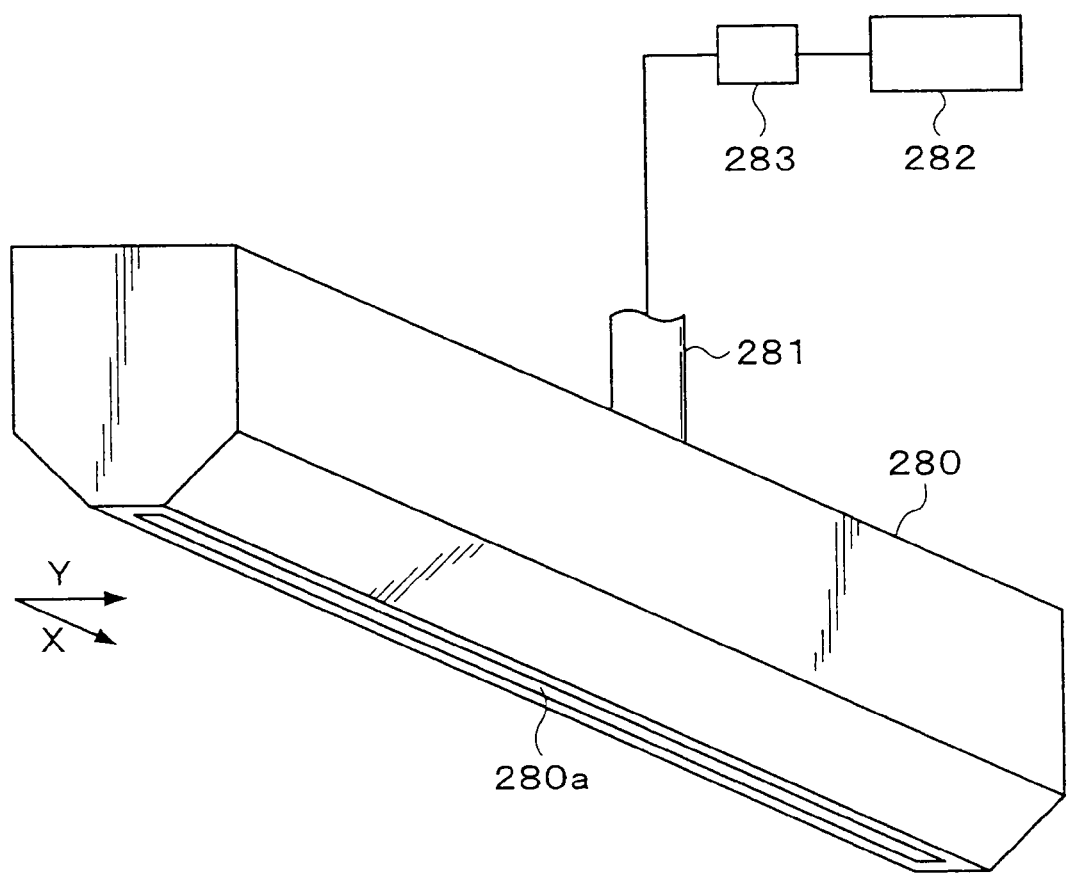
FIG. 15 is a perspective view of a coating nozzle having a discharge port in a slit form.
Figure 16:
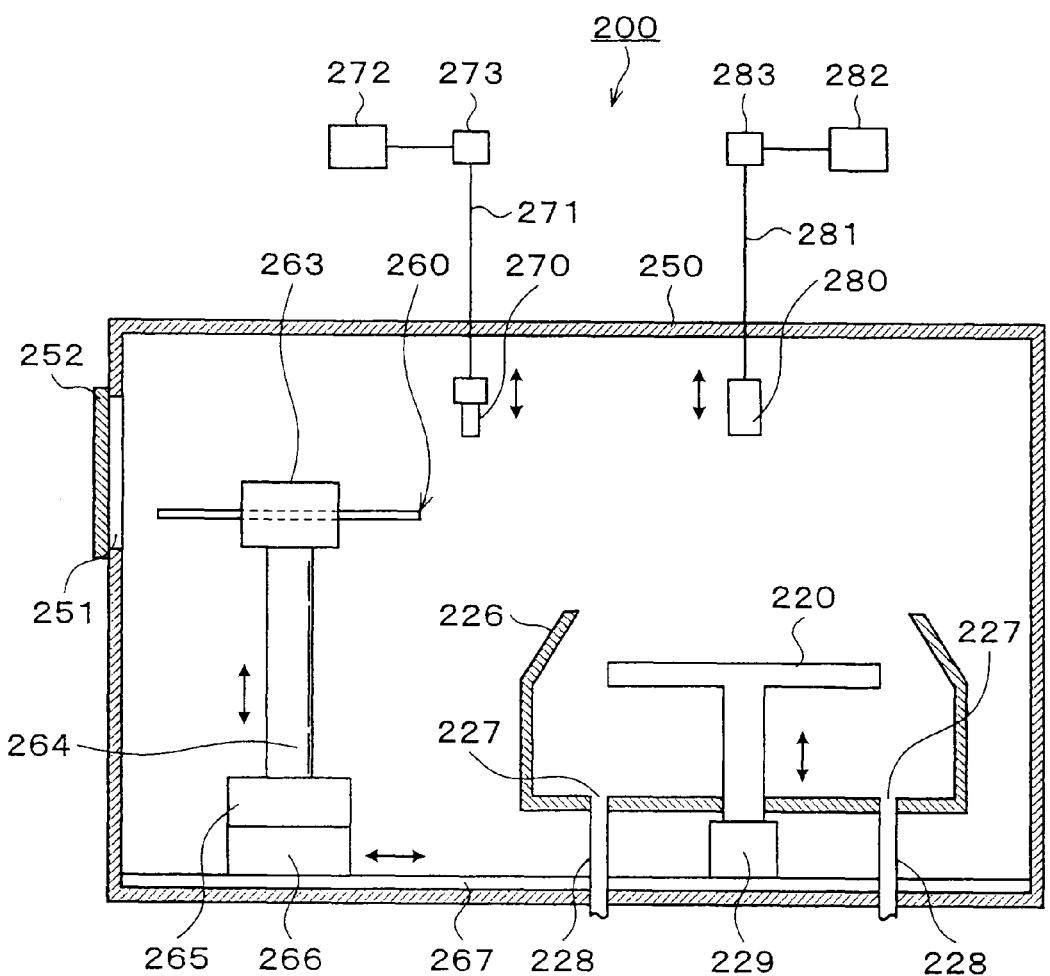
FIG. 16 is a longitudinal sectional view schematically showing the outline of a configuration of a coating film removing apparatus.
Figure 17:
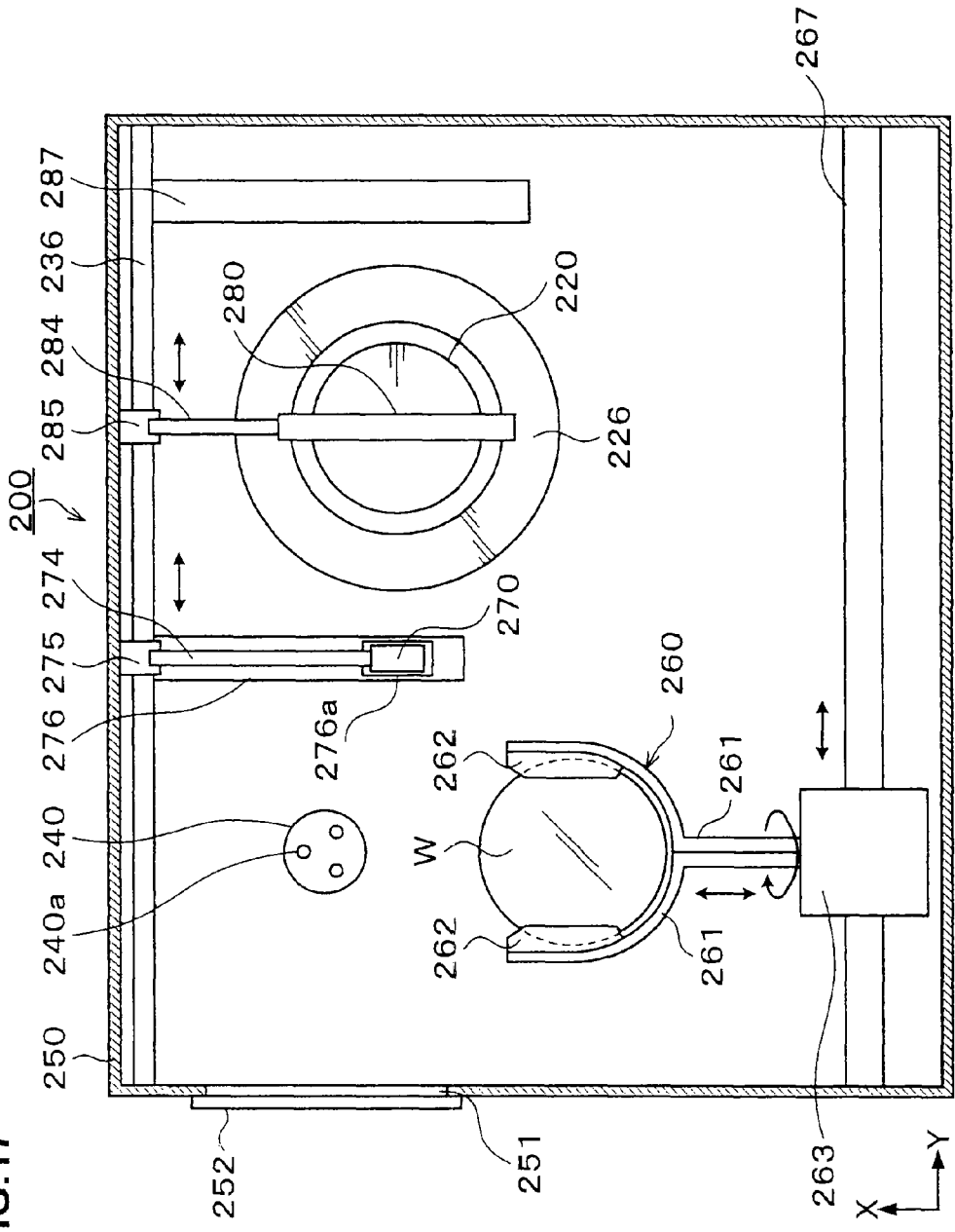
FIG. 17 is a plan view schematically showing the outline of a configuration of the coating film removing apparatus.

In place of the removing solution supply nozzle 230 of the coating film removing apparatus 200 used in the above embodiment, a removing solution supply nozzle 280 may be used which has a discharge port 280a in a slit form extending in the X-direction as shown in FIG. 15. To the upper portion of the removing solution supply nozzle 280, a removing solution supply pipe 281 is connected which leads to a removing solution supply source 282. The removing solution supply pipe 281 is also provided with a supply controller 283 including a valve, a flow control unit, and so on. As shown in FIG. 16 and FIG. 17, the removing solution supply nozzle 280 is formed, for example, longer than the width in the X-direction of the wafer W, and is connected to a moving mechanism 285 via an arm 284. The arm 284 can be moved by the moving mechanism 285 along the guide rail 236, from a waiting region 287 provided outside on the side of one end of the cup body 226 (the right side in FIG. 17) toward the other end side and vertically moved. The waiting region 287 can accommodate the removing solution supply nozzle 280.

In the case where the removing solution supply nozzle 280 is used as described above, movement of the moving mechanism 285 allows the removing solution to be discharged from the removing solution supply nozzle 280 to the rear surface of the wafer W. Accordingly, in place of the rotating mechanism 221 which rotates and raises and lowers the spin chuck 220, a raising and lowering mechanism 229 may be used which can only raise and lower the spin chuck 220 as shown in FIG. 16.

For the coating nozzle 330 of the coating film forming apparatus 300 used in the above embodiment, a coating nozzle may be used which has the above-described discharge port in a slit form.

Figure 18:
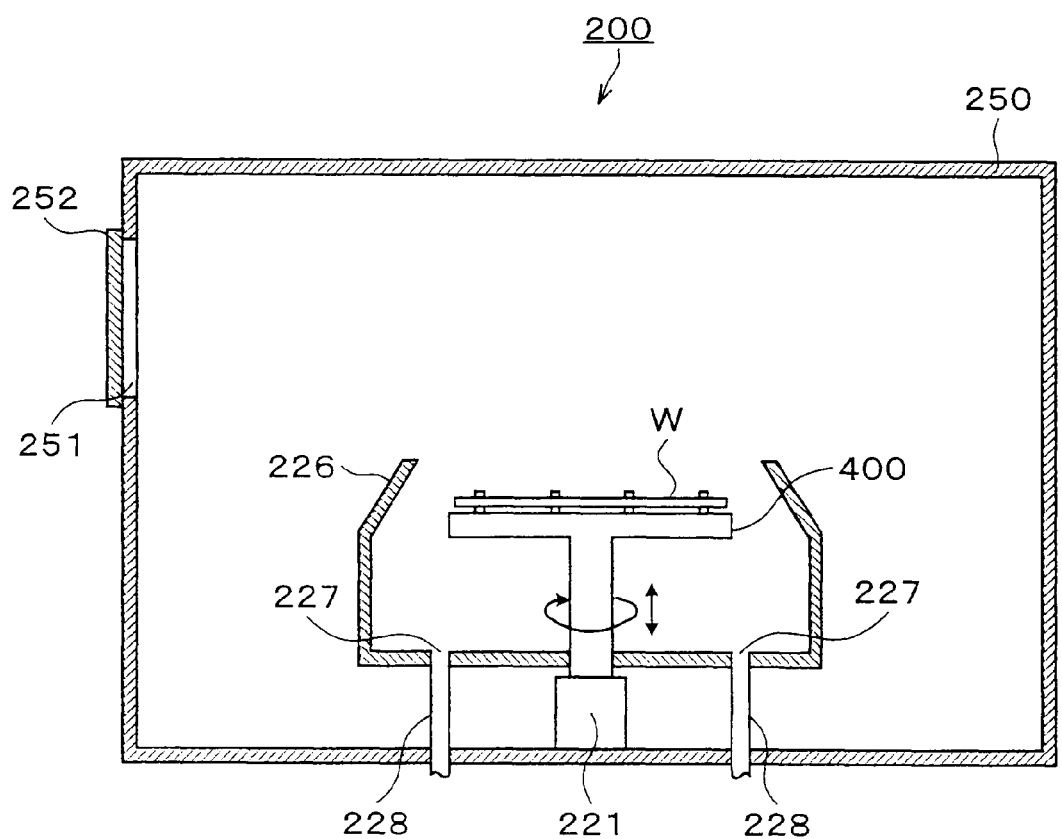
FIG. 18 is a longitudinal sectional view schematically showing the outline of a configuration of a coating film removing apparatus.
Figure 19:
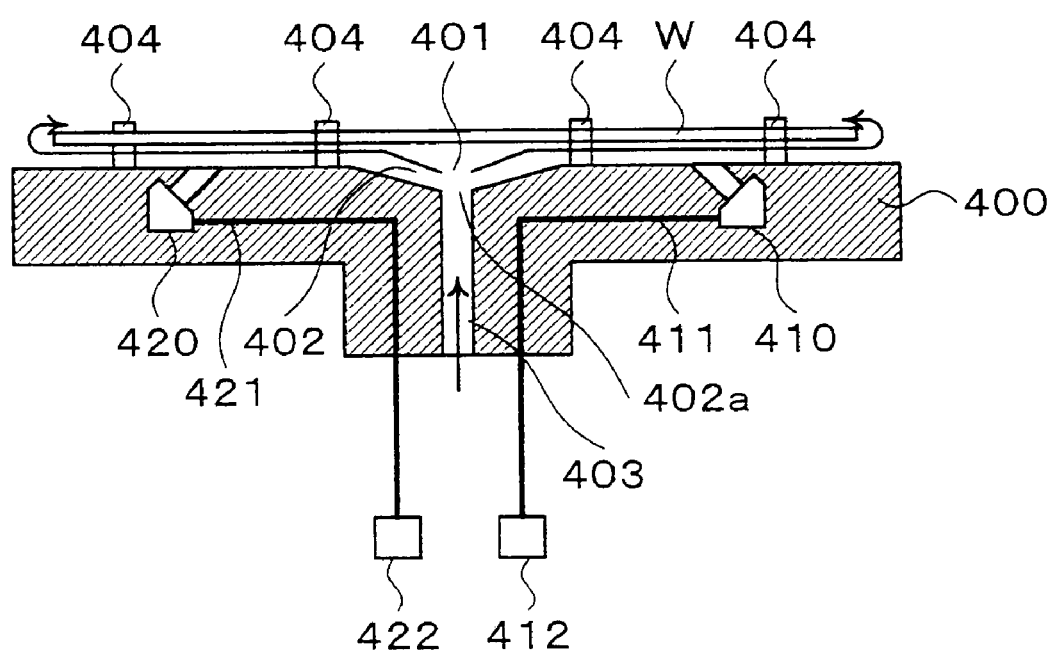
FIG. 19 is a longitudinal sectional view a spin chuck.

In place of the spin chuck 220 of the coating film removing apparatus 200 used in the above embodiment, a spin chuck 400 may be used which has a removing solution supply nozzle 410 and a rinse nozzle 420 therein as shown in FIG. 18 and FIG. 19. The removing solution supply nozzle 410 and the rinse nozzle 420 provided inside the spin chuck 400 are installed at a slant each inclining from the vertical direction toward the center. The removing solution supply nozzle 410 and the rinse nozzle 420 can discharge the removing solution and the rinse solution from the upper surface of the spin chuck 400 toward the lower surface of the wafer W, respectively.

The removing solution supply nozzle 410 is connected to a removing solution supply source 412 via a removing solution supply pipe 411 passing through the spin chuck 400. The rinse nozzle 420 is similarly connected to a rinse solution supply source 422 via a rinse solution supply pipe 421 passing through the spin chuck 400. At the central portion of the upper surface of the spin chuck 400, a recessed portion 402 is formed downward, so that a space 401 is formed between the recessed portion 402 and the wafer W. At the central portion of the upper surface of the spin chuck 400, a gas supply port 402a is formed which jets an inert gas, for example, nitrogen gas toward the space 401, and a gas supply pipe 403 penetrating through the spin chuck 400 is connected to the gas supply port 402a. On the upper surface of the spin chuck 400, for example, eight holding pins 404 for holding the peripheral portion of the wafer W are provided along the peripheral portion of the wafer W. The holding pin 404 has the same shape as that of the holding pin 222.

In this case, the wafer W transferred by the transfer body 101 to the coating film removing apparatus 200 is passed from the wafer transfer body 101 to the spin chuck 400 by raising the spin chuck 400. The inert gas is then jetted from the gas supply port 402a toward the space 401 to fix the wafer W to the spin chuck 400, and then the wafer W is lowered to a predetermined position. The rotating mechanism 221 rotates the wafer W, and the removing solution is discharged from the removing solution supply nozzle 400 to the rear surface of the wafer W to remove the coating film on the rear surface of the wafer W. Thereafter, the rinse solution is discharged from the rinse nozzle 410 to the rear surface of the wafer W to clean the rear surface of the wafer W. Using the coating film removing apparatus 200 as described above allows the coating film on the rear surface of the wafer W to be removed with the rear surface of the wafer W directed downward.

Note that in the case where such a spin chuck 400 is used, the removing solution can be discharged to the rear surface of the wafer W with the front surface of the wafer W directed upward, so that the wafer delivery table 140 and the transfer arm 260 which are provided for inverting the wafer W and members and mechanisms associated with them become unnecessary and thus may be omitted from the coating film removing apparatus 200.

Figure 20:
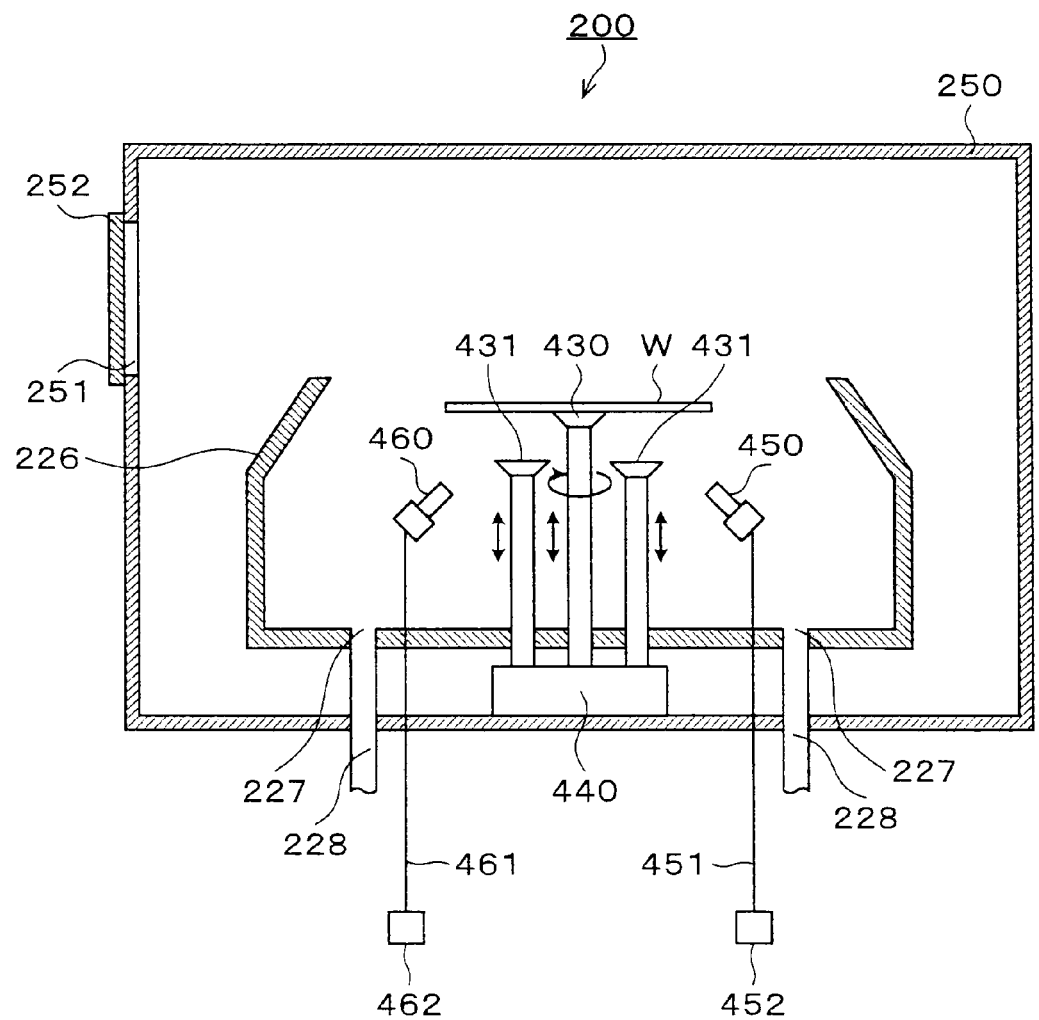
FIG. 20 is a longitudinal sectional view schematically showing the outline of a configuration of a coating film removing apparatus.

In place of the spin chuck 220 of the coating film removing apparatus 200 used in the above embodiment, three spin chucks 430, 431, and 431 may be used which vacuum-sucks the rear surface of the wafer W as shown in FIG. 20. The first spin chuck 430 is located to suction-hold the central portion of the wafer W. The second spin chucks 431 and 431 are located to suck the position other than the portion which is sucked by the first spin chuck 430 so that the two spin chucks 431 and 431 hold the wafer W. Below the spin chucks 430, 431 and 431, a rotating mechanism 440 is provided which can rotate and raise and lower the first spin chuck 430 and the second spin chucks 431 and 431 independently. Obliquely below the wafer W held by the spin chucks 430, 431 and 431, a removing solution supply nozzle 450 and a rinse nozzle 460 are separately provided in the cup body 226. The removing solution supply nozzle 450 is connected to a removing solution supply source 452 via a removing solution supply pipe 451. The rinse nozzle 460 is connected to a rinse solution supply nozzle 462 via a rinse solution supply pipe 461.

In this case, the wafer W transferred by the wafer transfer body 101 to the coating film removing apparatus 200 is passed from the wafer transfer body 101 to the first spin chuck 430 by raising the first spin chuck 430. The wafer W suction-held by the first spin chuck 430 is then lowered to a predetermined position. The wafer W is then rotated by the rotating mechanism 440, and the removing solution is discharged from the removing solution supply nozzle 450 to the rear surface of the wafer W to remove the coating film on the rear surface at a portion other than the portion which is sucked by the first spin chuck 430.

Subsequently, the rotation of the wafer W is stopped, the second spin chucks 431 and 431 are raised to suction-hold the rear surface of the wafer W, and the first spin chuck 430 is lowered. The wafer W is then rotated again, and the removing solution is discharged from the removing solution supply nozzle 450 to the rear surface of the wafer W to remove the coating film at the central portion which has been sucked by the first spin chuck 430. As a result, the coating solution on the entire rear surface of the wafer W can be removed.

Thereafter, the rinse solution is discharged from the rinse nozzle 460 to the rear surface of the wafer W to clean the rear surface of the wafer W. For this cleaning, the rear surface of the wafer W is cleaned in twice in which cleaning is performed with the wafer W being sucked by the first spin chuck 430 and cleaning is performed with the wafer W being sucked by the second spin chucks 431 and 431, whereby the entire rear surface of the wafer W can be cleaned. Using the coating film removing apparatus 200 as described above allows the coating film on the rear surface of the wafer W to be removed with the rear surface of the wafer W directed downward.

In the case where such spin chucks 430 and 431 are used, the removing solution can be discharged to the rear surface of the wafer W with the front surface of the wafer W directed upward, so that the wafer delivery table 140 and the transfer arm 260 which are provided for inverting the wafer W and members and mechanisms associated with them become unnecessary and thus may be omitted from the coating film removing apparatus 200.

In place of the lamp heating unit 341 in the coating film forming apparatus 300 in the above embodiment, any conventional ultraviolet irradiation unit (not shown) for applying ultraviolet rays and a conventional electron beam irradiation unit (not shown) for applying electron beams to the coating solution applied on the wafer W may be provided. This allows selective use of the lamp heating unit 341, the ultraviolet irradiation unit, or the electron beam irradiation unit depending on the kind of the coating solution in use.

Although the coating film removing apparatus 200 is provided in the coating and developing treatment system 1 in the above embodiment, the coating film removing apparatus 200 may be provided outside the coating and developing treatment system 1. As such an example, a coating film removing system 500 has, as shown in FIG. 21 and FIG. 22, a configuration in which, for example, a cassette station 501 for transferring 25 wafers W per cassette as a unit from/to the outside into/from the coating film removing system 500 and transferring the wafers W into/out of a cassette C; and a treatment station 502 for performing treatment of removing the coating film on the rear surface of the wafer W, are integrally connected.

Figure 21:
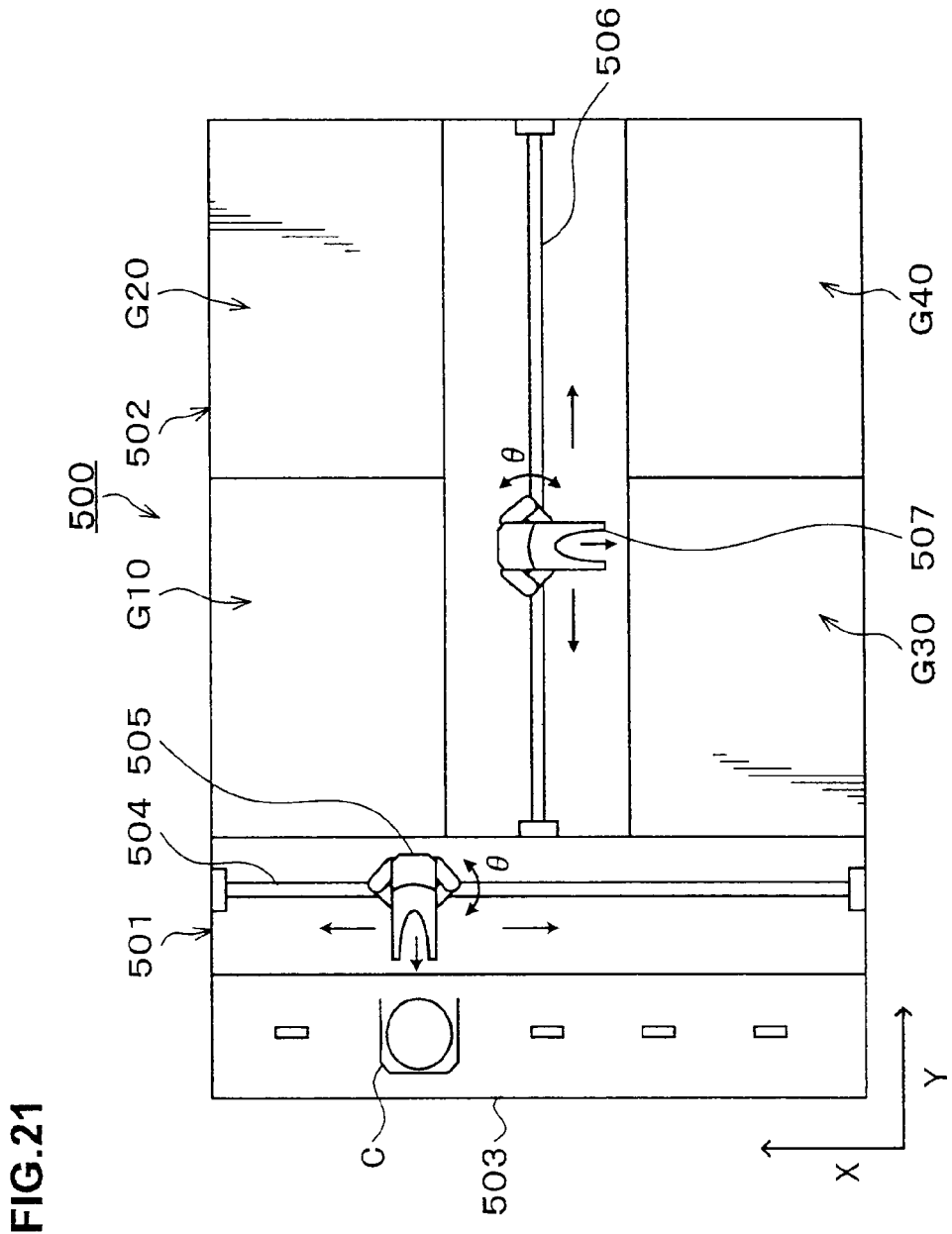
FIG. 21 is a plan view schematically showing the outline of a configuration of a coating film removing system.

In the cassette station 501, a cassette mounting table 503 is provided and configured such that a plurality of cassettes C can be mounted thereon in a line in an X-direction (a top-to-bottom direction in FIG. 21). In the cassette station 501, a wafer transfer body 505 is provided which is movable in the X-direction on a transfer path 504. The wafer transfer body 505 is also movable in a wafer-arrangement direction of the wafers W housed in the cassette C (a Z-direction; the vertical direction), and thus can selectively access the wafer W in each of the cassettes C arranged in the X-direction. The wafer transfer body 505 is rotatable in a θ-direction around a Z-axis, and can access a later-described coating film removing apparatus 200 on the treatment station 502 side.

On the side of the positive direction in the X-direction (the upward direction in FIG. 21) in the treatment station 502, treatment unit groups G10 and G20 are placed in order from the cassette station 501 side, and on the side of the negative direction in the X-direction (the downward direction in FIG. 21), treatment unit groups G30 and G40 are placed in order from the cassette station 501 side. Between the treatment unit groups G10 and G20, and the treatment unit groups G30 and G40, a wafer transfer body 507 which is movable in the Y-direction on a transfer path 506 is provided. The wafer transfer body 507 is also movable in the X-direction and the vertical direction (the Z-direction) and rotatable in the θ-direction around the Z-axis to selectively access the treatment units in the treatment unit groups G10, G20, G30, and G40 and transfer the wafer W to them.

Figure 22:
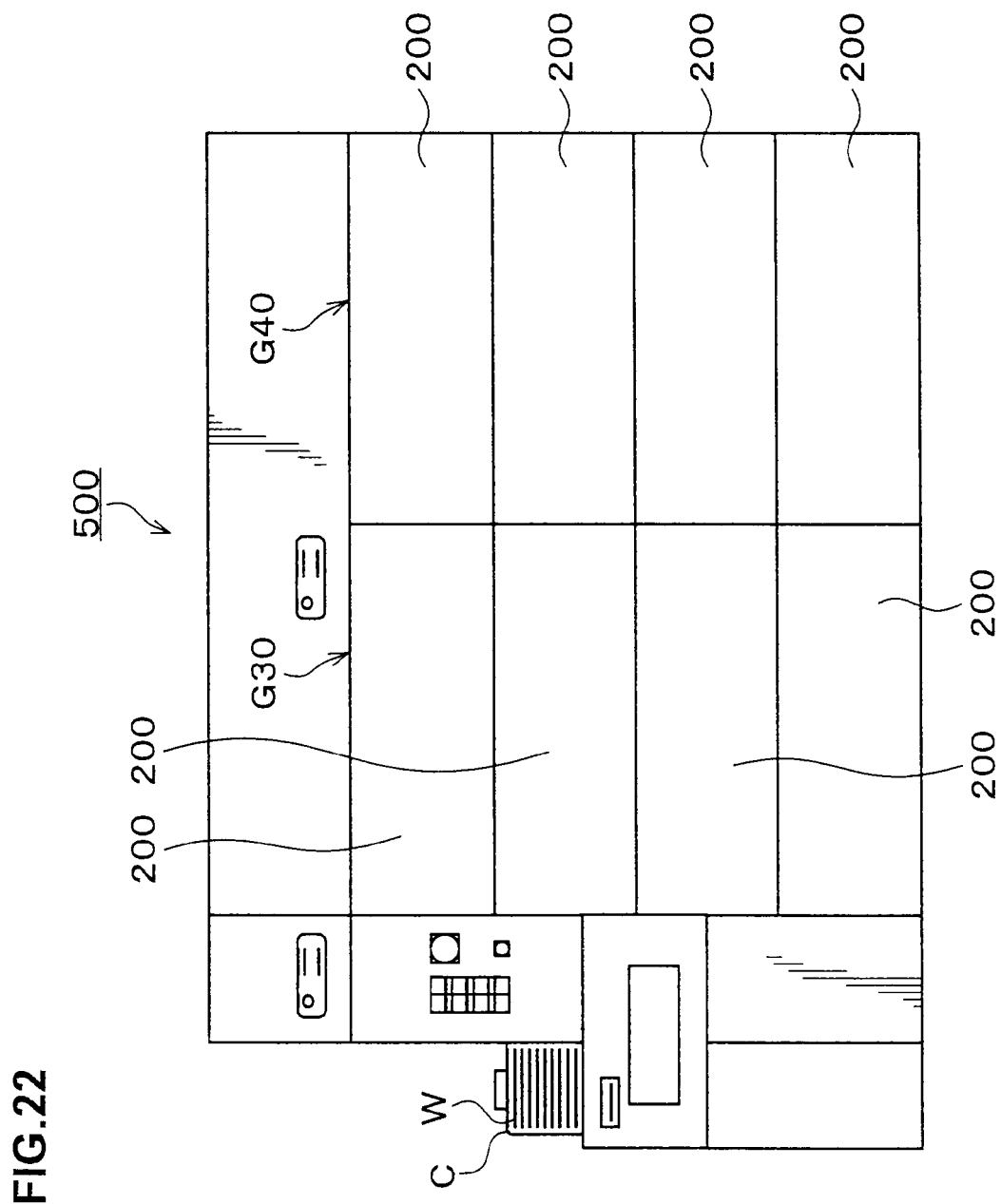
FIG. 22 is a front view of the coating film removing system.

In each of the treatment unit groups G30 and G40, as shown in FIG. 22, the coating film removing apparatuses 200 are four-tiered. Also in each of the treatment unit groups G10 and G20, the coating film removing apparatuses 200 are four-tiered. More specifically, a total of 16 coating film removing apparatuses 200 are provided in the treatment station 502. Since the plurality of coating film removing apparatuses 200 are provided in the coating film removing system 500, the coating films on the rear surfaces of a plurality of wafers W can be removed at the same time.

Figure 23:
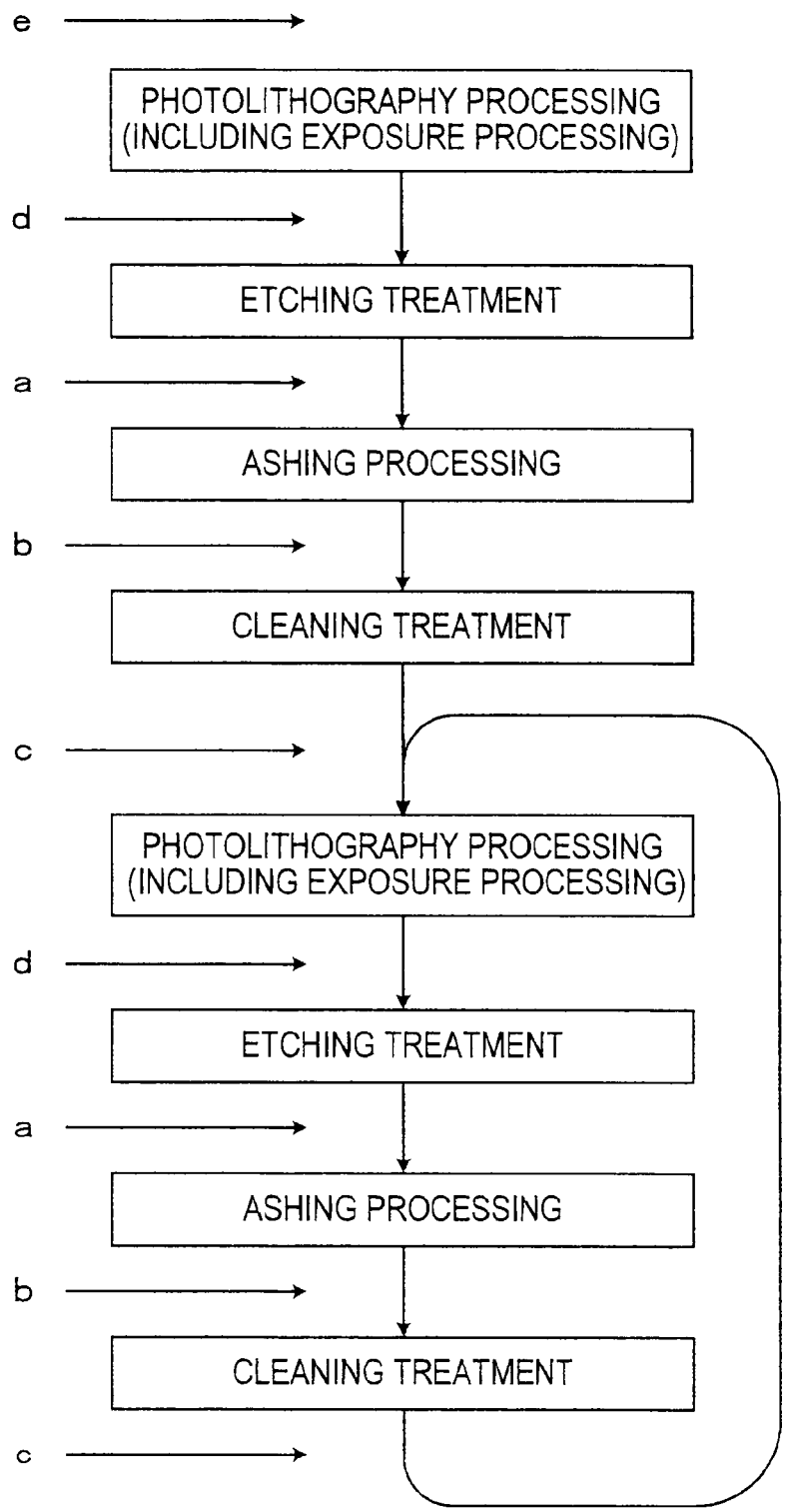
FIG. 23 is a flowchart showing a time to remove the coating film by the coating film removing system, and a time to form the coating film by the coating film forming system.

The removal of the coating film on the rear surface of the wafer W by the coating film removing system 500 is performed, for example, after the etching treatment of the wafer W and before the aching processing (an arrow a in FIG. 23). Thereby, even if the coating film on the rear surface of the wafer W gets minute scratches during performance of the etching treatment, the rear surface of the wafer W itself is protected by the coating film and thus never scratched, so that the rear surface of the wafer W can be flat for the exposure processing to be performed subsequent thereto. Note that the removal of the coating film by the coating film removing system 500 may be performed after the ashing processing and before the cleaning treatment (an arrow b in FIG. 23), or after the cleaning treatment and before the photolithography processing (an arrow c in FIG. 23).

Figure 24:
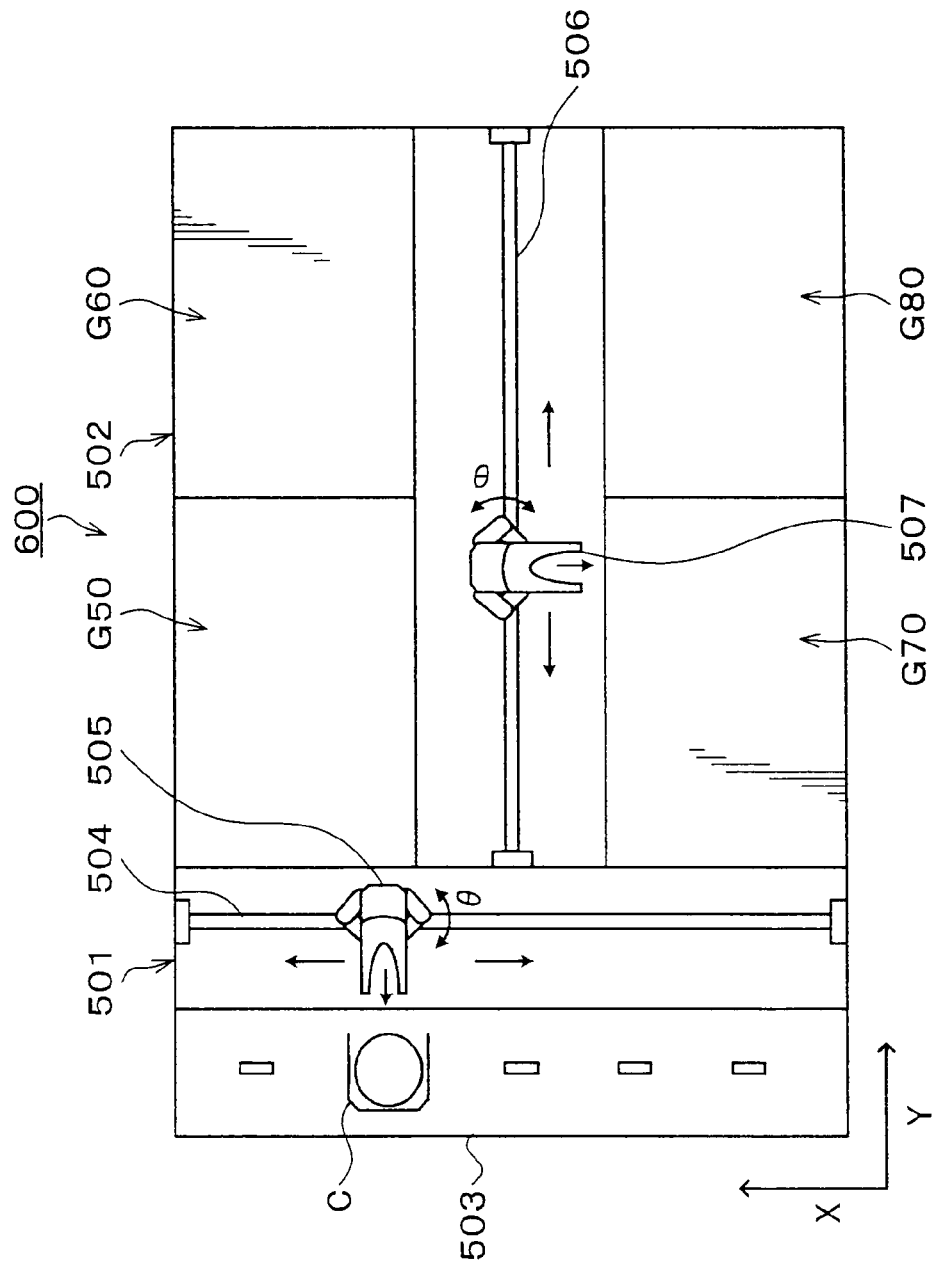
FIG. 24 is a plan view schematically showing the outline of a configuration of a coating film forming system.

Although the coating film forming apparatus 300 is provided in the coating and developing treatment system 1 in the above embodiment, the coating film forming apparatus 300 may be provided outside the coating and developing treatment system 1. As such an example, a coating film forming system 600 has a configuration in which treatment unit groups G50 to G80 as shown in FIG. 24, in place of the treatment unit groups G10 to G40 of the coating film removing system 500. In each of the treatment unit groups G50 to G80, the coating film forming apparatuses 300 are four-tiered.

The formation of the coating film on the rear surface of the wafer W by the coating film forming system 600 is performed, for example, after the photolithography processing for the wafer W and before the etching treatment (an arrow d in FIG. 23). Thereby, even if the coating film on the rear surface of the wafer W gets minute scratches during the etching treatment, the rear surface of the wafer W itself is protected by the coating film and thus never scratched, so that the rear surface of the wafer W can be flat for the exposure processing subsequent thereto. Note that the formation of the coating film on the rear surface of the wafer W by the coating film forming system 600 may be performed before the photolithography processing performed for the first time (an arrow e in FIG. 23).

Although the inside of the coating film forming apparatus 300 is divided into the first treatment chamber 311 and the second treatment chamber 312 in the above embodiment, the first treatment chamber 311 and the second treatment chamber 312 may be divided into separate units. More specifically, the coating film forming apparatus 300 may be divided into a unit for applying the coating solution from the coating nozzle 330 to the rear surface of the wafer W and a unit for heating the wafer W using the lamp heating unit 341 to cure the coating solution on the rear surface of the wafer W.

Although the coating film is formed on the rear surface of the wafer W by applying the coating solution in the above embodiment, a thin film may be formed on the rear surface of the wafer W, for example, by the CVD (Chemical Vapor Deposition) method. In other words, a material gas may be supplied to the rear surface of the wafer W to deposit into a thin film on the rear surface of the wafer W by chemical catalytic reaction so as to protect the rear surface of the wafer W.

Preferred embodiments of the present invention have been described above with reference to the accompanying drawings, but the present invention is not limited to the embodiments. It should be understood that various changes and modifications within the scope of the spirit as set forth in claims are readily apparent to those skilled in the art, and those should also be covered by the technical scope of the present invention. The present invention is also applicable, for example, to the case where the substrate is a substrate other than the wafer, such as an FPD (Flat Panel Display), a mask reticle for a photomask, or the like.

The present invention is useful to a method of treating a substrate, for example, a semiconductor wafer or the like, a coating film removing apparatus, and a substrate treatment system.

What is claimed is:

1. A substrate treatment method of performing at least photolithography processing and etching treatment for a substrate in this order a plurality of times, comprising the steps of:
   forming a resist film on a front surface of the substrate and performing exposure processing on the resist film on the front surface;
   inverting the substrate to direct a rear surface of the substrate upward and forming a coating film on the rear surface of the substrate after the exposure processing in the photolithography processing is performed on the resist film on the front surface of the substrate;
   inverting the substrate to direct the front surface of the substrate upward and performing the etching treatment on the resist film on the front surface of the substrate; and
   inverting the substrate to direct a rear surface of the substrate upward and removing the coating film from the rear surface of the substrate between the forming the coating film and performance of next exposure processing.

2. The substrate treatment method as set forth in claim 1, wherein said step of forming the coating film comprises the steps of:
   applying a coating solution to the rear surface of the substrate; and
   curing the coating solution applied on the rear surface of the substrate.

3. The substrate treatment method as set forth in claim 2, wherein the coating solution applied on the rear surface of the substrate is cured by being heated.

4. The substrate treatment method as set forth in claim 2, wherein the coating solution applied on the rear surface of the substrate is cured by being irradiated with ultraviolet rays or electron beams.

5. The substrate treatment method as set forth in claim 2, further comprising the step of:
   performing ashing processing and cleaning treatment on the front surface of the substrate after the performing the etching treatment on the resist film and before the removing the coating film from the rear surface of the substrate.

6. The substrate treatment method as set forth in claim 1, wherein said step of removing the coating film comprises the step of supplying a removing solution to the coating film.

7. The substrate treatment method as set forth in claim 1, further comprising the step of:
   immediately before said step of forming the coating film, cleaning the rear surface of the substrate.

\* \* \* \* \*